(12) United States Patent
Kurokawa

(10) Patent No.: US 8,717,806 B2
(45) Date of Patent: May 6, 2014

(54) STORAGE ELEMENT, STORAGE DEVICE, SIGNAL PROCESSING CIRCUIT, AND METHOD FOR DRIVING STORAGE ELEMENT

(75) Inventor: Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 66 days.

(21) Appl. No.: 13/342,276

(22) Filed: Jan. 3, 2012

(65) Prior Publication Data

US 2012/0182788 A1   Jul. 19, 2012

(30) Foreign Application Priority Data

Jan. 14, 2011   (JP) .................................. 2011-005614

(51) Int. Cl.
*G11C 11/00* (2006.01)

(52) U.S. Cl.
USPC ................. 365/154; 365/233.1; 365/189.05; 365/189.09

(58) Field of Classification Search
USPC ................. 365/156, 154, 149, 233.1, 189.05, 365/189.09; 327/217–218, 208
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,738,281 B2 | 5/2004 | Yokozeki |
| 6,788,567 B2 | 9/2004 | Fujimori |
| 6,944,045 B2 | 9/2005 | Fujimori |
| 6,972,986 B2 | 12/2005 | Peng et al. |
| 7,049,190 B2 | 5/2006 | Takeda et al. |
| 7,061,014 B2 | 6/2006 | Hosono et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

(Continued)

*Primary Examiner* — David Lam
(74) *Attorney, Agent, or Firm* — Fish & Richardson P.C.

(57) ABSTRACT

A storage element capable of retaining data even after supply of power supply voltage is stopped is provided. In the storage element retaining data in synchronization with a clock signal, with the use of a capacitor and a transistor having a channel in an oxide semiconductor layer, the data can be retained even after supply of power supply voltage is stopped. Here, when the transistor is turned off while the level of the clock signal is kept constant before the supply of power supply voltage is stopped, the data can be retained accurately in the capacitor. By applying such a storage element to each of a CPU, a memory, and a peripheral control device, supply of power supply voltage can be stopped in the entire system, so that the power consumption of the entire system can be reduced.

13 Claims, 16 Drawing Sheets

(56) References Cited

U.S. PATENT DOCUMENTS

| | | | |
|---|---|---|---|
| 7,064,346 B2 | 6/2006 | Kawasaki et al. | |
| 7,105,868 B2 | 9/2006 | Nause et al. | |
| 7,142,030 B2 * | 11/2006 | Osame et al. | 327/218 |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,616,040 B2 | 11/2009 | Motomura | |
| 7,674,650 B2 | 3/2010 | Akimoto et al. | |
| 7,732,819 B2 | 6/2010 | Akimoto et al. | |
| 8,004,481 B2 | 8/2011 | Yamazaki et al. | |
| 8,085,076 B2 | 12/2011 | Djaja et al. | |
| 8,362,538 B2 * | 1/2013 | Koyama et al. | 257/298 |
| 8,368,066 B2 | 2/2013 | Yamazaki et al. | |
| 8,410,838 B2 | 4/2013 | Kato et al. | |
| 8,411,492 B2 * | 4/2013 | Nardone et al. | 365/156 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0122581 A1 | 7/2003 | Inoue et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0071039 A1 | 4/2004 | Fujimori | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0229133 A1 | 10/2007 | Tam et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0170028 A1 | 7/2008 | Yoshida |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258789 A1 | 10/2008 | Motomura |
| 2008/0296568 A1 | 12/2008 | Ryu et al. |
| 2009/0002044 A1 | 1/2009 | Kobayashi |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0010493 A1 | 1/2011 | Kimura et al. |
| 2011/0121878 A1 | 5/2011 | Kato et al. |
| 2011/0156024 A1 | 6/2011 | Koyama et al. |
| 2011/0176357 A1 | 7/2011 | Koyama et al. |
| 2011/0187410 A1 | 8/2011 | Kato et al. |
| 2013/0057315 A1 | 3/2013 | Kato et al. |
| 2013/0127497 A1 | 5/2013 | Koyama |
| 2013/0222033 A1 | 8/2013 | Kato et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-078836 A | 3/1998 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-050208 A | 2/2006 |
| JP | 2007-096055 A | 4/2007 |
| JP | 2007-123861 A | 5/2007 |
| JP | 2007-125823 A | 5/2007 |
| WO | 20041114391 A1 | 12/2004 |

OTHER PUBLICATIONS

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; Agne Gijutsu Center (with English translation).

Ohara, H et al., "Amorphous In-Ga-Zn-Oxide TFTs with Suppressed Variation for 4.0 inch QVGA AMOLED Display,"AM-FFD '09 Digest of Technical Papers, Jul. 1, 2009, pp. 227-230, The Japan Society of Applied Physics.

(56) References Cited

OTHER PUBLICATIONS

Orita, M et al., "Amorphous transparent conductive oxide InGaO3)ZnO)m (m<4):a Zn4s conductor," Philosophical Magazine, 2001, vol. 81, No. 5, pp. 501-515.

Orita, M et al., "Mechanism of Electrical Conductivity of Transparent InGaZn04," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID DIGEST '09 : SID International Symposium Digest of Technical Papers, May 31, 2009, pp. 184-187.

Osada, T et al., "Development of Driver-Integrated Panel Using Amorphous IN-GA-ZN-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID DIGEST '08 : SID International Symposium Digest of Technical Papers, May 20, 2008, vol. 39, pp. 629-632.

Park, J et al., "Amorphous Indium-Gallium-Zinc Oxide Tfts and Their Application for Large Size Amoled," AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. Amoled Display With Driver Circuit Using Amorphous IN-GA-ZN-Oxide TFTS," IDW '09 : Proceedings of the 16TH International Display Workshops, 2009, pp. 689-692.

Son, K et al., "42.4L: Late-News Paper: 4 Inch QVGA Amoled Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer.Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology,"SID Digest '04: SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing M003 As a Charge-Generation Layer," Adv. Mater. (Advanced Materials), 2006, vol. 18, No. 3, pp. 339-342.

(56) References Cited

OTHER PUBLICATIONS

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZZ] At Temperatures Over 1000°C," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08: SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=in,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07: SID International Symposium Digest of Technical Papers, 2007, vol. 38, pp. 1673-1676.

Mo, Y et al., "Amorphous Oxide TFT Backplanes for Large Size AMOLED Displays," IDW '08: Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09: SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTS With a Novel Passivation Layer," SID Digest '09 : SID International Symposium Digest of Technical Papers, May 31, 2009, pp. 284-287.

\* cited by examiner

STORAGE ELEMENT, STORAGE DEVICE, SIGNAL PROCESSING CIRCUIT, AND METHOD FOR DRIVING STORAGE ELEMENT

BACKGROUND OF THE INVENTION

1. Field of the Invention

The present invention relates to nonvolatile storage elements that do not lose stored logical states even after the power is turned off. The present invention also relates to storage devices and signal processing circuits including the storage elements. Further, the present invention relates to methods for driving the storage elements, the storage devices, and the signal processing circuits. Furthermore, the present invention relates to electronic devices including the signal processing circuits.

2. Description of the Related Art

Many central processing units (CPUs) adopt architecture called a stored program system. In the stored program system, instructions to be processed by the CPU and data necessary for processing are stored in memories (storage devices) such as a main memory and a hard disk. The CPU performs processing by sequentially reading the instructions and the data from the memories.

In the architecture, the operating speed of the CPU depends strongly on the speed of access from the CPU to the memory. In other words, in order to improve the operating speed of the CPU, it is necessary to improve the operating speed of the memory. Further, since the memory needs to store instructions to be processed by the CPU and data necessary for processing, the memory needs to have large capacity. However, a high-speed large-capacity memory is very expensive, so that such a memory cannot be easily employed.

Thus, a system is devised in which a small-capacity high-speed memory (hereinafter referred to as a cache memory), a large-capacity low-speed memory (hereinafter referred to as a main storage device or a main memory), and a larger-capacity lower-speed memory are used in combination.

Access (reading or writing) from a CPU to a main memory is controlled by, for example, a semiconductor device called a northbridge. Access to a memory that has larger capacity and lower speed than the main memory (e.g., a hard disk) is controlled by, for example, a semiconductor device called a southbridge.

A system using a CPU includes memories such as a cache memory, a main memory, and a hard disk, and a peripheral control device for controlling access (reading or writing) to these memories. Note that a peripheral device such as a PCI device, a network device, or an audio device might be included in the system using a CPU. Here, a semiconductor device for controlling these memories and the peripheral device is referred to as a peripheral control device. The northbridge and the southbridge are peripheral control devices. Further, memories such as a main memory and a hard disk also correspond to peripheral devices unless otherwise specified.

Note that the system using a CPU might be a system where the northbridge and the southbridge are merged into one peripheral control device, a system using a CPU in which peripheral control devices are merged, or the like. In the following description, a system using a CPU is referred to as a PC system. Note that a CPU or a system using a CPU is also referred to as a signal processing circuit.

Reference 1 discloses a structure where a volatile memory such as an SRAM and a nonvolatile memory are used in combination as a cache memory.

REFERENCE

Reference 1: Japanese Published Patent Application No. 10-078836

SUMMARY OF THE INVENTION

In the case where data in a volatile memory is stored in a nonvolatile memory located around the volatile memory while supply of power supply voltage is stopped in a signal processing circuit, a magnetic element or a ferroelectric is mainly used as such a nonvolatile memory; thus, steps of manufacturing the signal processing circuit are complex.

In the case where data in the volatile memory is stored in an external memory while supply of power supply voltage is stopped in the signal processing circuit, it takes a long time to return the data from the external memory to the volatile memory. Thus, backup of data using the external memory is not suitable in the case where the power is off for a short time in order to reduce power consumption.

In view of the foregoing problems, it is an object to provide a storage element with a novel structure where data can be retained after supply of power supply voltage is stopped and a method for driving the storage element.

It is an object to provide a signal processing circuit whose power consumption can be reduced and a method for driving the signal processing circuit. In particular, it is an object to provide a signal processing circuit whose power consumption can be reduced by turning off the power for a short time and a method for driving the signal processing circuit.

In particular, it is an object to reduce the power consumption of the entire system using a CPU.

(One Aspect of Structure of Storage Element)

One aspect of the structure of a storage element in the present invention is as follows.

(Structure of Storage Element)

A storage element includes a first phase inverter, a second phase inverter, a transistor which has a channel in an oxide semiconductor layer, a capacitor, and a switch. The storage element has the following structure. An output terminal of the first phase inverter is electrically connected to one of a source and a drain of the transistor. The other of the source and the drain of the transistor is electrically connected to one of a pair of electrodes of the capacitor and an input terminal of the second phase inverter. An output terminal of the second phase inverter is electrically connected to an input terminal of the first phase inverter. A signal corresponding to data is input to the first phase inverter through the switch which is on. The first phase inverter outputs an inversion signal of a signal input while power supply voltage is supplied. The second phase inverter outputs an inversion signal of a signal input while power supply voltage is supplied. On or off of the switch is selected in synchronization with either one or both a clock signal and an inversion signal of the clock signal. A control signal which is different from the clock signal and the inversion signal of the clock signal is input to a gate of the transistor.

In the structure of the storage element, the control signal which is different from the clock signal and the inversion signal of the clock signal is input to the gate of the transistor which has a channel in the oxide semiconductor layer. In other words, on and off of the transistor can be independently controlled by the control signal which is different from the clock signal and the inversion signal of the clock signal.

In the structure of the storage element, as each of the first phase inverter and the second phase inverter, for example, an inverter, a NAND circuit, a NOR circuit, or the like can be used. For example, an analog switch, a transistor, or the like can be used as the switch. Alternatively, an arithmetic circuit to which either one or both the clock signal and the inversion signal of the clock signal are input can be used as the switch.

Note that in the structure of the storage element, the second phase inverter may output an inversion signal of a signal input in synchronization with either one or both the clock signal and the inversion signal of the clock signal or may have a floating (high impedance) output while power supply voltage is supplied. For example, a three-state buffer, a clocked inverter, or the like can be used as the second phase inverter In the structure of the storage element, in the case where power supply voltage is supplied and the transistor is on, a feedback loop is formed by the first phase inverter and the second phase inverter. Data is retained with this feedback loop. Thus, in the case where power supply voltage is supplied and the transistor is on, a flip-flop circuit or a latch circuit can be formed by the first phase inverter and the second phase inverter. In other words, the structure of the storage element corresponds to the structure of a flip-flop circuit or a latch circuit for retaining data in synchronization with the clock signal (or either one or both the clock signal and the inversion signal of the clock signal) to which the capacitor and the transistor which has a channel in the oxide semiconductor layer are added. Specifically, the one of the pair of electrodes of the capacitor is electrically connected to a node in which data in the flip-flop circuit or the latch circuit is retained and which is provided between an output terminal of the storage element and an output terminal of an arithmetic circuit (an arithmetic element) such as a phase inverter included in the flip-flop circuit or the latch circuit. The transistor which has a channel in the oxide semiconductor layer is added so that the node to which the one electrode of the capacitor is connected is electrically connected to the output terminal of the arithmetic circuit (the arithmetic element) such as a phase inverter included in the flip-flop circuit or the latch circuit selectively.

In the structure of the storage element, the potential of the one of the pair of electrodes of the capacitor can be an output potential of the storage element. The output potential is a potential corresponding to data input to the storage element. Note that the potential of the one of the pair of electrodes of the capacitor may be input to the arithmetic circuit (the arithmetic element), and an output of the arithmetic circuit (the arithmetic element) may be an output of the storage element. Alternatively, the potential of the one of the pair of electrodes of the capacitor may be output through the switch as the output of the storage element.

As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both the clock signal and the inversion signal of the clock signal are input can be used as the switch.

A structure where the arithmetic circuit (the arithmetic element) or the switch is included as a component of the storage element, the potential of the one of the pair of electrodes of the capacitor is input to the arithmetic circuit (the arithmetic element) or the switch, and an output from the arithmetic circuit (the arithmetic element) or the switch is used as the output of the storage element has the following advantages. The length of a wiring for electrically connecting the one of the pair of electrodes of the capacitor to the arithmetic circuit (the arithmetic element) or the switch can be decreased. Thus, the potential of the one of the pair of electrodes of the capacitor can be prevented from fluctuating by leakage. In this manner, data retained in the storage element can be prevented from changing.

In the structure of the storage element, a fixed potential can be input to the other of the pair of electrodes of the capacitor. For example, a low power supply potential can be input.

In the structure of the storage element, the transistor can have two gates above and below with the oxide semiconductor layer provided therebetween. A control signal can be input to one gate, and a different control signal can be input to the other gate. The different control signal may be a signal with a fixed potential. The fixed potential may be either a low power supply potential or a high power supply potential. Note that the two gates may be electrically connected to each other and the control signal may be input to the gates. The threshold voltage or the like of the transistor can be controlled by a signal input to the other gate. Further, the off-state current of the transistor can be reduced. The on-state current of the transistor can also be increased.

In the structure of the storage element, in the case where the first phase inverter and the second phase inverter each include a transistor, the transistor can be a transistor which has a channel in a layer made of a semiconductor other than an oxide semiconductor or a substrate made of a semiconductor other than an oxide semiconductor. For example, the transistor can be a transistor which has a channel in a silicon layer or a silicon substrate. Alternatively, all the transistors that are used in the first phase inverter and the second phase inverter can be transistors which have channels in oxide semiconductor layers. Alternatively, some of the transistors that are used in the first phase inverter and the second phase inverter can be transistors which have channels in oxide semiconductor layers, and the other transistors can be transistors which have channels in layers made of a semiconductor other than an oxide semiconductor or substrates made of a semiconductor other than an oxide semiconductor.

In the structure of the storage element, in the case where the switch is formed using a transistor, the transistor can be a transistor which has a channel in a layer made of a semiconductor other than an oxide semiconductor or a substrate made of a semiconductor other than an oxide semiconductor. For example, the transistor can be a transistor which has a channel in a silicon layer or a silicon substrate. Alternatively, all the transistors that are used as the switches can be transistors which have channels in oxide semiconductor layers. Alternatively, some of the transistors that are used as the switches can be transistors which have channels in oxide semiconductor layers, and the other transistors can be transistors which have channels in layers made of a semiconductor other than an oxide semiconductor or substrates made of a semiconductor other than an oxide semiconductor.

(Method for Driving Storage Element)

In the storage element, in the case where supply of power supply voltage is stopped in order to reduce power consumption after the supply of power supply voltage, and then power supply voltage is supplied again, a driving method can be as follows.

(Normal Operation)

While power supply voltage is supplied to the storage element, data is input through the switch which is turned on in synchronization with the clock signal and the inversion signal of the clock signal, and the feedback loop formed by the first phase inverter and the second phase inverter holds a signal corresponding to the data (or an inversion signal of the signal). At this time, the transistor which has a channel in the oxide semiconductor layer is on.

(Operation before Stop of Supply of Power Supply Voltage)

Before supply of power supply voltage to the storage element is stopped, the levels (the signal potentials) of the clock signal and the inversion signal of the clock signal are fixed. In other words, the levels (the signal potentials) of the clock signal and the inversion signal of the clock signal remain the levels (the signal potentials) of the clock signal and the inversion signal of the clock signal in a state in which predetermined data is retained by the feedback loop. In short, a period during which the levels (the signal potentials) of the clock signal and the inversion signal of the clock signal are not changed is provided, though the clock signal and the inversion signal of the clock signal are usually signals whose levels (signal potentials) are periodically changed between high levels and low levels. Here, a period during which the levels (the signal potentials) of the clock signal and the inversion signal of the clock signal are fixed is also referred to as a clock signal fixed period. In the clock signal fixed period, the transistor which has a channel in the oxide semiconductor layer is turned off. In this manner, a signal (a potential) corresponding to the data retained by the feedback loop is held in the capacitor.

When the transistor which has a channel in the oxide semiconductor layer is turned off in a state in which the levels of the clock signal and the inversion signal of the clock signal are kept constant in this manner, a signal (a potential) corresponding to data retained by the feedback loop can be held in the capacitor while the signal (the potential) corresponding to the data is prevented from fluctuating.

Here, in the structure of the storage element, the control signal which is different from the clock signal and the inversion signal of the clock signal is input to the gate of the transistor which has a channel in the oxide semiconductor layer. In other words, on and off of the transistor can be independently controlled by the control signal which is different from the clock signal and the inversion signal of the clock signal. Thus, before supply of power supply voltage to the storage element is stopped, the transistor can be turned off while the levels of the clock signal and the inversion signal of the clock signal are kept constant. In this manner, data can be accurately retained in the capacitor.

(Stop of Supply of Power Supply Voltage)

After the above operation, supply of power supply voltage to the storage element is stopped. Note that with a structure where the transistor is an enhancement transistor (a normally off transistor) and a ground potential (0 V) is input to the gate of the transistor after the supply of power supply voltage to the storage element is stopped, the transistor can be kept off. Even after the supply of power supply voltage to the storage element is stopped, the signal corresponding to the data retained by the feedback loop is held in the capacitor. Here, since the transistor which has a channel in the oxide semiconductor layer has extremely low leakage current, the signal (the potential) held in the capacitor can be held for a long time. In this manner, even after the supply of power supply voltage is stopped, the storage element retains data. After the supply of power supply voltage is stopped, supply of the clock signal and the inversion signal of the clock signal is stopped. Thus, the supply of power supply voltage can be stopped while the signal (the potential) corresponding to the data retained in the capacitor is prevented from fluctuating. Further, when the supply of the clock signal and the inversion signal of the clock signal is stopped, power for supplying the clock signal and the inversion signal of the clock signal can be reduced.

(Restart of Supply of Power Supply Voltage)

First, a clock signal and an inversion signal of the clock signal whose levels are returned to and fixed to the levels (the signal potentials) in the stop of the supply of power supply voltage is supplied. In this manner, a clock signal fixed period is started. In the clock signal fixed period, supply of power supply voltage to the storage element is restarted. Then, after the supply of power supply voltage is restarted, the transistor is turned on. After the transistor is turned on, fixing of the levels (the signal potentials) of the clock signal and the inversion signal of the clock signal is canceled. In other words, the clock signal and the inversion signal of the clock signal are returned to normal signals whose levels (signal potentials) are periodically changed between high levels and low levels. Thus, the storage element can retain the data retained before the supply of power supply voltage is stopped again by the feedback loop, so that the normal operation can be restarted.

When the supply of power supply voltage is restarted in a state where the levels of the clock signal and the inversion signal of the clock signal are kept constant in this manner, the potential of a node for retaining data in the feedback loop can be prevented from fluctuating. Further, after that, the transistor is turned on, so that the signal (the potential) held in the capacitor can be the potential of the node while the potential of the node for retaining data in the feedback loop is prevented from fluctuating. Accordingly, the signal (the potential) held in the capacitor can be accurately held by the feedback loop.

The above is the method for driving the storage element.

The following driving method is another example of the method for driving the storage element.

In a first period, the transistor is turned on while power supply voltage is supplied, and a clock signal and an inversion signal of the clock signal whose signal potentials are periodically changed between high levels and low levels are supplied. A signal corresponding to data is input to the first phase inverter through the switch which is turned on in synchronization with the clock signal and the inversion signal of the clock signal. The first phase inverter outputs an inversion signal of the signal input. A signal is input to the second phase inverter from the first phase inverter through the transistor which is on, and the second phase inverter outputs an inversion signal of the signal.

In a second period following the first period, after the clock signal and the inversion signal of the clock signal are made to have fixed potentials while power supply voltage is supplied, the transistor is turned off. Note that in the case where both of the clock signal and the inversion signal of the clock signal are input to the switch, the clock signal and the inversion signal of the clock signal have different fixed potentials.

In a third period following the second period, the supply of power supply voltage is stopped while the transistor is kept off and the potentials of the clock signal and the inversion signal of the clock signal are kept constant.

In a fourth period following the third period, the supply of the clock signal and the inversion signal of the clock signal is stopped while the transistor is kept off and the supply of power supply voltage is stopped.

In a fifth period following the fourth period, the clock signal and the inversion signal of the clock signal are made to have the fixed potentials input in the second period while the transistor is kept off and the supply of power supply voltage is stopped.

In a sixth period following the fifth period, after the supply of power supply voltage is started while the potentials of the clock signal and the inversion signal of the clock signal are kept constant, the transistor is turned on.

In a seventh period following the sixth period, the clock signal and the inversion signal of the clock signal whose signal levels are periodically changed between high levels and low levels are supplied while power supply voltage is supplied and the transistor is kept on. A signal corresponding to data is input to the first phase inverter through the switch which is turned on in synchronization with the clock signal and the inversion signal of the clock signal. The first phase inverter outputs an inversion signal of the signal input. A signal is input to the second phase inverter from the first phase inverter through the transistor which is on, and the second phase inverter outputs an inversion signal of the signal.

The first period and the seventh period correspond to periods during which the normal operation is performed. The second period corresponds to a period during which the operation before the stop of the supply of power supply voltage is performed. The third period and the fourth period correspond to periods during which the supply of power supply voltage is stopped. The fifth period and the sixth period correspond to periods during which the supply of power supply voltage is restarted.

(Storage Device and Signal Processing Circuit)

One aspect of a storage device in the present invention can be a storage device including one or more of the storage elements. Further, one aspect of a signal processing circuit in the present invention can be a signal processing circuit including the storage device. For example, the storage element is used for a storage device such as a register or a cache memory included in the signal processing circuit.

Further, the signal processing circuit may include a variety of logic circuits such as arithmetic circuits which transmit and receive data to and from the storage device in addition to the storage device. Not only the supply of power supply voltage to the storage device but also the supply of power supply voltage to the arithmetic circuit for transmitting and receiving data to and from the storage device may be stopped.

One aspect of a signal processing circuit in the present invention may include a CPU, a memory, and a peripheral control device for controlling access to the memory and the CPU. The CPU, the memory, and the peripheral control device may each include the storage element. Further, supply of power supply voltage may be stopped in the entire signal processing circuit including the CPU, the memory, and the peripheral control device.

While power supply voltage is not supplied to the storage element for retaining data in synchronization with a clock signal, data can be retained in the capacitor. Here, a transistor which has a channel in an oxide semiconductor layer has extremely low off-state current. For example, the off-state current of the transistor which has a channel in the oxide semiconductor layer is much lower than the off-state current of a transistor whose channel is formed using crystalline silicon. Thus, with the use of the transistor, the signal can be held in the capacitor for a long time even in a period during which power supply voltage is not supplied to the storage element. Consequently, the storage element can retain the stored data while the supply of power supply voltage is stopped.

A control signal which is different from the clock signal and the inversion signal of the clock signal is input to the gate of the transistor which has a channel in the oxide semiconductor layer. In other words, on and off of the transistor can be independently controlled by the control signal which is different from the clock signal and the inversion signal of the clock signal. Thus, before the supply of power supply voltage to the storage element is stopped, the transistor can be turned off while the levels of the clock signal and the inversion signal of the clock signal are kept constant. In this manner, data can be accurately retained in the capacitor. Further, when the transistor is turned on after the supply of power supply voltage is restarted while the levels of the clock signal and the inversion signal of the clock signal are kept constant, a signal (a potential) held in the capacitor can be the potential of the node while the potential of the node for retaining data in the feedback loop is prevented from fluctuating. Accordingly, the signal (the potential) held in the capacitor can be accurately held by the feedback loop.

By applying such a storage element to a signal processing circuit, data can be prevented from being lost because of the stop of the supply of power supply voltage. In addition, after the supply of power supply voltage is restarted, the storage element can return to the state before the supply of power supply voltage is stopped in a short time.

In particular, by applying such a storage element to each of a CPU, a memory, and a peripheral control device, supply of power supply voltage can be stopped in the entire system including the CPU. In addition, after the supply of power supply voltage is restarted, the storage element can return to the state before the supply of the power supply voltage is stopped in a short time. Since the power can be off even for a short time, the power consumption of the entire system can be reduced.

DETAILED DESCRIPTION OF THE INVENTION

Figure 1:
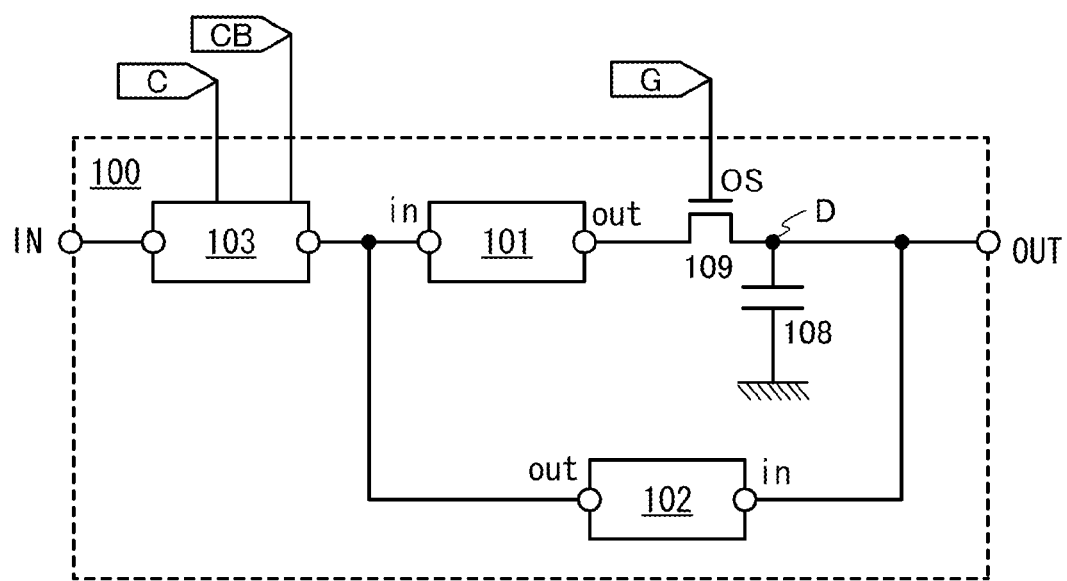
FIG. 1 is a circuit diagram of a storage element.

Embodiments of the present invention will be described in detail below with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Note that functions of a "source" and a "drain" might interchange when a transistor of opposite polarity is used or the direction of current flow is changed in circuit operation, for example. Thus, in this specification, the terms "source" and "drain" can interchange.

The expression "electrically connected" includes the case where components are connected to each other through an object having any electric action. Here, there is no particular limitation on an object having any electric action as long as electric signals can be transmitted and received between components that are connected to each other. Examples of an "object having any electric action" include a switching element such as a transistor, a resistor, an inductor, a capacitor, and an element with a variety of functions in addition to an electrode and a wiring.

In addition, even when independent components are electrically connected to each other in a circuit diagram, there is the case where one conductive film has functions of a plurality of components, such as the case where part of a wiring functions as an electrode. The expression "electrically connected" in this specification also includes such a case where one conductive film has functions of a plurality of components.

The term "over" or "below" does not necessarily mean that a component is placed "directly on" or "directly under" another component. For example, the expression "a gate electrode over a gate insulating layer" does not exclude the case where another component is placed between the gate insulating layer and the gate electrode.

The position, size, range, or the like of each component illustrated in drawings and the like is not accurately represented in some cases for easy understanding. Thus, the disclosed invention is not necessarily limited to the position, size, range, or the like disclosed in the drawings and the like.

Ordinal numbers such as "first", "second", and "third" are used in order to avoid confusion among components.
(Embodiment 1)

A signal processing circuit includes a storage device. The storage device includes one or more storage elements which can store 1-bit data.

Note that a signal processing circuit of the present invention includes, in its category, a large scale integrated circuit (LSI) such as a CPU, a microprocessor, an image processing circuit, a digital signal processor (DSP), or a field programmable gate array (FPGA), and the like.
(Structure of Storage Element)

FIG. 1 illustrates an example of the circuit diagram of a storage element. A storage element 100 includes a phase inverter 101, a phase inverter 102, a transistor 109 which has a channel in an oxide semiconductor layer, a capacitor 108, and a switch 103. In FIG. 1, "OS" is written beside a transistor in order to indicate that the transistor 109 has a channel in the oxide semiconductor layer. Note that the storage element 100 may further include a different circuit element such as a diode, a resistor, or an inductor when needed.

Note that it is possible not to provide the capacitor 108 by actively utilizing parasitic capacitance or the like of the transistor.

An output terminal (represented as "out" in the diagram) of the phase inverter 101 is electrically connected to one of a source and a drain of the transistor 109. The other of the source and the drain of the transistor 109 is electrically connected to one of a pair of electrodes of the capacitor 108 and an input terminal (represented as "in" in the diagram) of the phase inverter 102. An output terminal (represented as "out" in the diagram) of the phase inverter 102 is electrically connected to an input terminal (represented as "in" in the diagram) of the phase inverter 101. A signal corresponding to data input from an input terminal (represented as "IN" in the diagram) of the storage element 100 is input to the phase inverter 101 through the switch 103 which is on. The phase inverter 101 outputs an inversion signal of a signal input while power supply voltage is supplied. The phase inverter 102 outputs an inversion signal of a signal input while power supply voltage is supplied. On or off of the switch 103 is selected in synchronization with a clock signal (represented as "C" in the diagram) and an inversion signal (represented as "CB" in the diagram) of the clock signal. Note that on or off of the switch 103 may be selected in synchronization with one of the clock signal (C) and the inversion signal (CB) of the clock signal. A control signal (represented as "G" in the diagram) which is different from the clock signal (C) and the inversion signal (CB) of the clock signal is input to a gate of the transistor 109.

The control signal (G) which is different from the clock signal (C) and the inversion signal (CB) of the clock signal is input to the gate of the transistor 109. In other words, on and off of the transistor 109 can be independently controlled by the control signal (G) which is different from the clock signal (C) and the inversion signal (CB) of the clock signal.

As each of the phase inverter 101 and the phase inverter 102, for example, an inverter, a NAND circuit, a NOR circuit, or the like can be used. For example, an analog switch, a transistor, or the like can be used as the switch 103. Alternatively, an arithmetic circuit to which either one or both the clock signal (C) and the inversion signal (CB) of the clock signal are input can be used as the switch.

Note that the phase inverter 102 may output an inversion signal of a signal input in synchronization with either one or both the clock signal (C) and the inversion signal (CB) of the clock signal or may have a floating (high impedance) output while power supply voltage is supplied. For example, a three-state buffer, a clocked inverter, or the like can be used as the phase inverter 102.

In the case where power supply voltage is supplied and the transistor 109 is on, a feedback loop is formed by the phase inverter 101 and the phase inverter 102. Data is retained with this feedback loop. Thus, in the case where power supply voltage is supplied and the transistor 109 is on, a flip-flop circuit or a latch circuit can be formed by the phase inverter 101 and the phase inverter 102. In other words, the structure in FIG. 1 corresponds to the structure of a flip-flop circuit or a latch circuit for retaining data in synchronization with the clock signal (C) (and/or the inversion signal (CB) of the clock signal) to which the capacitor 108 and the transistor 109 are added. Specifically, the one of the pair of electrodes of the capacitor 108 is electrically connected to a node (represented as "D" in the diagram) in which data in the flip-flop circuit or the latch circuit is retained and which is provided between an output terminal (represented as "OUT" in the diagram) of the storage element 100 and the output terminal (out) of the phase inverter 101 included in the flip-flop circuit or the latch circuit. The transistor 109 is added so that the output terminal (out) of the phase inverter 101 included in the flip-flop circuit or the latch circuit is electrically connected to the node (D) to which the one electrode of the capacitor 108 is connected selectively.

In the structure in FIG. 1, the potential of the one of the pair of electrodes of the capacitor 108 (the potential of the node (D)) can be an output potential of the storage element 100. The output potential is a potential corresponding to data input to the storage element 100. Note that the potential of the one of the pair of electrodes of the capacitor 108 may be input to an arithmetic circuit (an arithmetic element), and an output of the arithmetic circuit (the arithmetic element) may be an output of the storage element 100. Alternatively, the potential of the one of the pair of electrodes of the capacitor 108 may be output through the switch as the output of the storage element 100.

As the arithmetic circuit (the arithmetic element), a buffer, an inverter, a NAND circuit, a NOR circuit, a three-state buffer, a clocked inverter, or the like can be used. For example, an analog switch, a transistor, or the like can be used as the switch. Alternatively, an arithmetic circuit (an arithmetic element) to which either one or both the clock signal and the inversion signal of the clock signal are input can be used as the switch.

A structure where the arithmetic circuit (the arithmetic element) or the switch is included as a component of the storage element 100, the potential of the one of the pair of electrodes of the capacitor 108 is input to the arithmetic circuit (the arithmetic element) or the switch, and an output from the arithmetic circuit (the arithmetic element) or the switch is used as the output of the storage element 100 has the following advantages. The length of a wiring for electrically connecting the one of the pair of electrodes of the capacitor 108 to the arithmetic circuit (the arithmetic element) or the switch can be decreased. Thus, the potential of the one of the pair of electrodes of the capacitor 108 (the potential of the node (D)) can be prevented from fluctuating by leakage. In this manner, data retained in the storage element 100 can be prevented from changing.

In the structure in FIG. 1, the other of the pair of electrodes of the capacitor 108 is grounded (i.e., a ground potential is applied to the other of the pair of electrodes of the capacitor 108); however, this embodiment is not limited to this structure. A fixed potential can be input to the other of the pair of electrodes of the capacitor 108. Note that the ground potential can be a low power supply potential.

In the structure in FIG. 1, the transistor 109 can have two gates above and below with the oxide semiconductor layer provided therebetween. The control signal (G) can be input to one gate, and a different control signal can be input to the other gate. The different control signal may be a signal with a fixed potential. The fixed potential may be either a low power supply potential or a high power supply potential. Note that the two gates may be electrically connected to each other and the control signal (G) may be input to the gates. The threshold voltage or the like of the transistor 109 can be controlled by a signal input to the other gate. Further, the off-state current of the transistor 109 can be reduced. The on-state current of the transistor can also be increased.

In the structure in FIG. 1, in the case where the phase inverter 101 and the phase inverter 102 are each formed using a transistor, the transistor can be a transistor which has a channel in a layer made of a semiconductor other than an oxide semiconductor or a substrate made of a semiconductor other than an oxide semiconductor. For example, the transistor can be a transistor which has a channel in a silicon layer or a silicon substrate. Alternatively, all the transistors that are used in the phase inverter 101 and the phase inverter 102 can be transistors which have channels in oxide semiconductor layers. Alternatively, some of the transistors that are used in the phase inverter 101 and the phase inverter 102 can be transistors which have channels in oxide semiconductor layers, and the other transistors can be transistors which have channels in layers made of a semiconductor other than an oxide semiconductor or substrates made of a semiconductor other than an oxide semiconductor.

In the structure in FIG. 1, in the case where the switch 103 is formed using a transistor, the transistor can be a transistor which has a channel in a layer made of a semiconductor other than an oxide semiconductor or a substrate made of a semiconductor other than an oxide semiconductor. For example, the transistor can be a transistor which has a channel in a silicon layer or a silicon substrate. Alternatively, all the transistors that are used as the switches 103 can be transistors which have channels in oxide semiconductor layers. Alternatively, some of the transistors that are used as the switches 103 can be transistors which have channels in oxide semiconductor layers, and the other transistors can be transistors which have channels in layers made of a semiconductor other than an oxide semiconductor or substrates made of a semiconductor other than an oxide semiconductor.

Here, the transistor which has a channel in the silicon layer or the silicon substrate has higher switching speed and higher on-state current than the transistor which has a channel in the oxide semiconductor layer. Thus, in a circuit that includes the transistor which has a channel in the silicon layer or the silicon substrate and the transistor which has a channel in the oxide semiconductor layer in combination, the operating speed of the circuit is improved and leakage current can be reduced. With the use of the combination of the transistor which has a channel in the silicon layer or the silicon substrate and the transistor which has a channel in the oxide semiconductor layer in the storage element 100, the operating speed of the storage element 100 is improved and power consumption can be reduced.

The above is the structure of the storage element 100. Next, a method for driving the storage element 100 is described.

(Method for Driving Storage Element)

In the storage element 100, in the case where supply of power supply voltage is stopped in order to reduce power consumption after the supply of power supply voltage, and then power supply voltage is supplied again, a driving method can be as follows. The driving method is described with reference to the timing chart in FIG. 2. In the timing chart in FIG. 2, IN represents the signal potential of data input to the input terminal (IN) of the storage element 100; C represents the signal potential of the clock signal (C); CB represents the signal potential of the inversion signal (CB) of the clock signal; G represents the potential of the control signal (G); and VDD represents power supply voltage. The case where VDD is 0 V (corresponding to a low level in the diagram) corresponds to the case where power supply voltage is not supplied. The symbol D represents the potential of the node (D).

Figure 2:
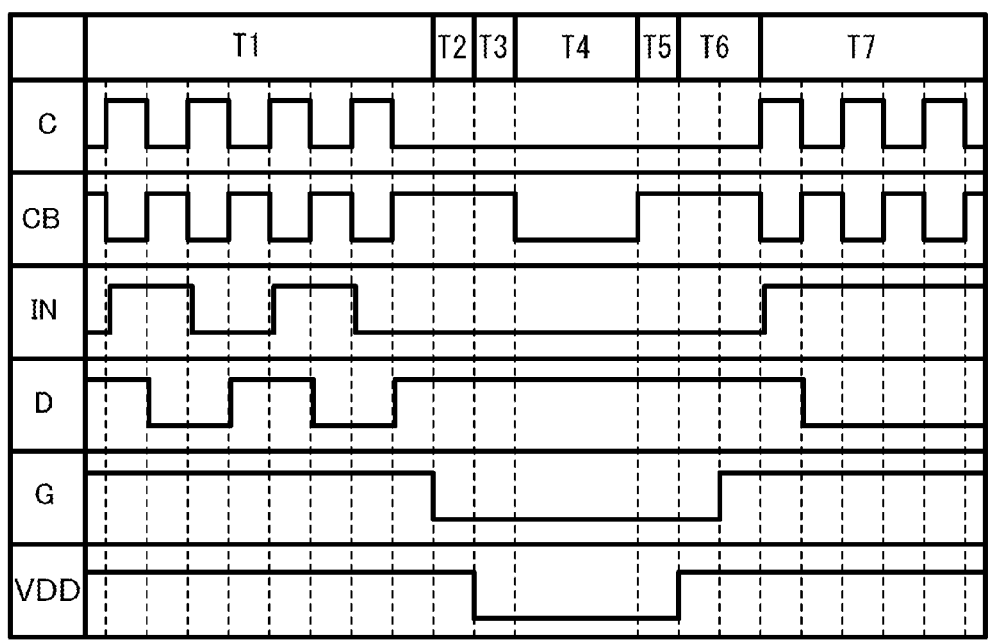
FIG. 2 is a timing chart showing the operation of a storage element.

Note that in the driving method illustrated in the timing chart in FIG. 2, in the structure in FIG. 1, the switch 103 is turned on when the clock signal (C) has a low-level potential and the inversion signal (CB) of the clock signal has a high-level potential, and the switch 103 is turned off when the clock signal (C) has a high-level potential and the inversion signal (CB) of the clock signal has a low-level potential. In other words, when the signal potential of the clock signal (C) is changed from a high level into a low level (hereinafter such a phenomenon is referred to as a clock fall), the signal potential of IN at this time is input to the phase inverter 101 through the switch 103.

However, this embodiment is not limited thereto. The switch 103 may be turned on when the clock signal (C) has a high-level potential and the inversion signal (CB) of the clock signal has a low-level potential, and the switch 103 may be turned off when the clock signal (C) has a low-level potential and the inversion signal (CB) of the clock signal has a high-level potential. In other words, when the signal potential of the clock signal (C) is changed from a low level into a high level (hereinafter such a phenomenon is referred to as a clock rise), the signal potential of IN at this time may be input to the phase inverter 101 through the switch 103.

As described above, a storage element of the present invention can have a structure where the transistor 109 and the capacitor 108 are added to a flip-flop circuit for storing data in synchronization with the rise or fall of the clock signal (C) (and/or the inversion signal (CB) of the clock signal), i.e., a so-called edge sensitive latch circuit. Note that this embodiment is not limited to the edge sensitive latch circuit. The storage element of the present invention can have a structure where the transistor 109 and the capacitor 108 are added to a flip-flop circuit for storing data when the clock signal (C) (and/or the inversion signal (CB) of the clock signal) has a high potential or a low potential, i.e., a so-called level sensitive latch circuit.

Further, in the driving method illustrated in the timing chart in FIG. 2, the transistor 109 is an n-channel transistor, the transistor 109 is turned on when the control signal G has a high-level potential, and the transistor 109 is turned off when the control signal G has a low-level potential. However, this embodiment is not limited thereto. The transistor 109 may be a p-channel transistor, the transistor 109 may be turned on when the control signal G has a low-level potential, and the transistor 109 may be turned off when the control signal G has a high-level potential.

(Normal Operation)

A first period (represented as T1 in the diagram) can be referred to as a normal operation period. In the first period (T1), the transistor 109 is turned on while power supply voltage (VDD) is supplied (while power supply voltage which is higher than 0 V is supplied), and the clock signal (C) and the inversion signal (CB) of the clock signal whose signal potentials are periodically changed between high levels and low levels are supplied. The signal potential (IN) of data is input to the phase inverter 101 through the switch 103 which is turned on in synchronization with the clock signal (C) and the inversion signal (CB) of the clock signal. The phase inverter 101 outputs an inversion signal of the signal input. In other words, the phase inverter 101 outputs a low-level potential when the signal potential input is a high-level potential and outputs a high-level potential when the signal potential input is a low-level potential. Note that since signal delay actually occurs, signal delay occurs from the time the signal potentials of the clock signal (C) and the inversion signal (CB) of the clock signal are changed, so that the output potential of the phase inverter 101 (the potential of the node (D)) is changed. A signal is input to the phase inverter 102 from the phase inverter 101 through the transistor 109 which is on, and the phase inverter 102 outputs an inversion signal of the signal. In other words, the phase inverter 102 outputs a low-level potential when the signal potential input is a high-level potential and outputs a high-level potential when the signal potential input is a low-level potential.

In other words, in the first period (T1), data is input through the switch 103 which is turned on in synchronization with the clock signal (C) and the inversion signal (CB) of the clock signal, and the feedback loop formed by the phase inverter 101 and the phase inverter 102 holds a signal corresponding to the data (or an inversion signal of the signal). At this time, the transistor 109 is on.

(Operation before Stop of Supply of Power Supply Voltage)

A second period (represented as T2 in the diagram) can be referred to as a period during which operation before the stop of the supply of power supply voltage is performed. In the second period (T2), before the supply of power supply voltage to the storage element 100 is stopped (VDD is set to 0 V), the levels (the signal potentials) of the clock signal (C) and the inversion signal (CB) of the clock signal are fixed. In other words, the levels (the signal potentials) of the clock signal (C) and the inversion signal (CB) of the clock signal remain the levels (the signal potentials) of the clock signal (C) and the inversion signal (CB) of the clock signal in a state in which predetermined data is retained by the feedback loop. In short, in the normal operation, the clock signal (C) and the inversion signal (CB) of the clock signal are signals whose levels (signal potentials) are periodically changed between high levels and low levels, and a clock signal fixed period during which the levels (the signal potentials) of the clock signal (C) and the inversion signal (CB) of the clock signals are not changed is provided. In the clock signal fixed period, the transistor 109 is turned off. In this manner, a signal (a potential) corresponding to the data retained by the feedback loop is held in the capacitor 108.

When the transistor 109 is turned off in a state in which the levels of the clock signal (C) and the inversion signal (CB) of the clock signal are kept constant in this manner, a signal (a potential) corresponding to data retained by the feedback loop can be held in the capacitor 108 while the signal (the potential) corresponding to the data is prevented from fluctuating.

Here, the control signal (G) which is different from the clock signal (C) and the inversion signal (CB) of the clock signal is input to the gate of the transistor 109. In other words, on and off of the transistor 109 can be independently controlled by the control signal (G) which is different from the clock signal (C) and the inversion signal (CB) of the clock signal. Thus, before the supply of power supply voltage to the storage element 100 is stopped, the transistor 109 can be turned off while the levels of the clock signal (C) and the inversion signal (CB) of the clock signal are kept constant. In this manner, data can be accurately retained in the capacitor 108.

(Stop of Supply of Power Supply Voltage)

A third period (represented as T3 in the diagram) and a fourth period (T4) following the third period (T3) can be referred to as periods during which the supply of power supply voltage is stopped. In the third period (T3), supply of power supply voltage (VDD) to the storage element 100 is stopped. Note that with a structure where the transistor 109 is an enhancement transistor (a normally off transistor) and a ground potential (0 V) is input to the gate of the transistor 109 after the supply of power supply voltage to the storage element 100 is stopped, the transistor 109 can be kept off. Even after the supply of the power supply voltage (VDD) to the storage element 100 is stopped, the signal corresponding to the data retained by the feedback loop is held in the capacitor 108. Here, since the transistor 109 has extremely low leakage current, the signal (the potential) held in the capacitor 108 can be held for a long time. In this manner, even after the supply of the power supply voltage (VDD) is stopped, the storage element 100 retains data. After the supply of the power supply voltage (VDD) is stopped, supply of the clock signal (C) and the inversion signal (CB) of the clock signal is stopped in the fourth period (T4). Thus, the supply of the power supply voltage (VDD) can be stopped while the signal (the potential) corresponding to the data retained in the capacitor 108 is prevented from fluctuating. Here, the second period (T2) and the third period (T3) can also be referred to as clock signal fixed periods. In addition, the fourth period (T4) can also be referred to as a clock signal stop period. Further, when the supply of the clock signal (C) and the inversion signal (CB) of the clock signal is stopped, the power consumption of the storage element 100 can be further reduced.

(Restart of Supply of Power Supply Voltage)

A fifth period (represented as T5 in the diagram) and a sixth period (T6) following the fifth period (T5) can be referred to as periods during which supply of power supply voltage is restarted. In the fifth period (T5), the clock signal (C) and the inversion signal (CB) of the clock signal whose levels are returned to and fixed to the levels (the signal potentials) in the stop of the supply of the power supply voltage (VDD) (in the second period (T2)) are supplied. In this manner, the clock signal fixed period is started. In the sixth period (T6), the supply of the power supply voltage (VDD) to the storage element 100 is restarted while the levels (the signal potentials) of the clock signal (C) and the inversion signal (CB) of the clock signal are fixed. Then, after the supply of the power supply voltage (VDD) is restarted, the transistor 109 is turned on. Thus, the storage element 100 can retain the data retained before the supply of the power supply voltage (VDD) is stopped again by the feedback loop.

In a seventh period (T7) following the sixth period (T6), fixing of the levels (the signal potentials) of the clock signal (C) and the inversion signal (CB) of the clock signal is canceled. In other words, the clock signal (C) and the inversion signal (CB) of the clock signal are returned to normal signals whose levels (signal potentials) are periodically changed between high levels and low levels. Thus, the normal operation can be restarted.

When the supply of the power supply voltage (VDD) is restarted in a state where the levels of the clock signal (C) and the inversion signal (CB) of the clock signal are kept constant in this manner, the potential of a node for retaining data in the feedback loop can be prevented from fluctuating. Further, after that, the transistor 109 is turned on, so that the signal (the potential) held in the capacitor 108 can be the potential of the node (D) while the potential of the node (D) for retaining data in the feedback loop is prevented from fluctuating. Accordingly, the signal (the potential) held in the capacitor 108 can be accurately held by the feedback loop.

The above is the method for driving the storage element.

In the storage element of the present invention and the method for driving the storage element, while power supply voltage is not supplied to the storage element 100 for retaining data in synchronization with a clock signal, data can be retained in the capacitor 108. Here, the transistor 109 has extremely low off-state current. For example, the off-state current of the transistor 109 is much lower than the off-state current of a transistor whose channel is formed using crystalline silicon. Thus, the signal can be held in the capacitor 108 for a long time even in a period during which power supply voltage is not supplied to the storage element 100. Consequently, the storage element 100 can retain the stored data while the supply of power supply voltage is stopped.

A control signal which is different from the clock signal and the inversion signal of the clock signal is input to the gate of the transistor 109. In other words, on and off of the transistor 109 can be independently controlled by the control signal which is different from the clock signal and the inversion signal of the clock signal. Thus, before the supply of power supply voltage to the storage element 100 is stopped, the transistor 109 can be turned off while the levels of the clock signal and the inversion signal of the clock signal are kept constant. In this manner, data can be accurately retained in the capacitor 108. Further, when the transistor 109 is turned on after the supply of power supply voltage is restarted while the levels of the clock signal and the inversion signal of the clock signal are kept constant, a signal (a potential) held in the capacitor 108 can be the potential of the node (D) while the potential of the node (D) for retaining data in the feedback loop is prevented from fluctuating. Accordingly, the signal (the potential) held in the capacitor 108 can be accurately held by the feedback loop.

By applying the storage element 100 to a signal processing circuit, data can be prevented from being lost because of the stop of the supply of power supply voltage. In addition, after the supply of power supply voltage is restarted, the storage element can return to the state before the power is turned off in a short time.

In particular, by applying the storage element 100 to each of a CPU, a memory, and a peripheral control device, supply of power supply voltage can be stopped in the entire system including the CPU. In addition, after the supply of power supply voltage is restarted, the storage element can return to the state before the supply of power supply voltage is stopped in a short time. Since the power can be off even for a short time, the power consumption of the entire system can be reduced.

This embodiment can be combined with any of the other embodiments as appropriate.

(Embodiment 2)

In this embodiment, the structure of a storage device including the plurality of storage elements in Embodiment 1 is described.

Figure 3A:
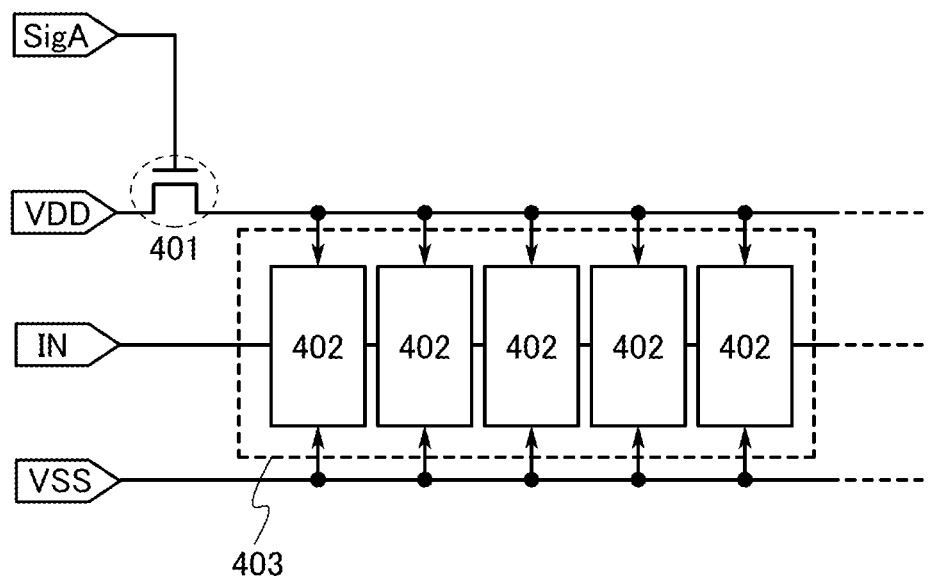
FIGS. 3A and 3B each illustrate the structure of a storage device.

FIG. 3A illustrates a structure example of a storage device in this embodiment. The storage device in FIG. 3A includes a switching element 401 and a storage element group 403 including a plurality of storage elements 402. Specifically, as each of the storage elements 402, the storage element 100 whose structure is described in Embodiment 1 can be used. A high power supply potential VDD is supplied to each of the storage elements 402 included in the storage element group 403 through the switching element 401. Further, the potential of the signal IN and a low power supply potential VSS are supplied to each of the storage elements 402 included in the storage element group 403.

Note that the plurality of storage elements 402 included in the storage element group 403 may be connected such that an output of one storage element 402 is an input of a different storage element 402 and that an output of the different storage element 402 is an input of another storage element 402. In other words, the plurality of storage elements 402 included in the storage element group 403 may be cascaded. At this time, in the case where the storage element 100 whose structure is illustrated in FIG. 1 is used as the storage element 402, a clock signal and an inversion signal of the clock signal are supplied so that one storage element 402 and the adjacent storage element 402 do not have the same timings at which the switches 103 are turned on. Thus, the storage element group 403 can also be used as a shift register.

In FIG. 3A, a transistor is used as the switching element 401, and switching of the transistor is controlled by a control signal Sig A supplied to a gate electrode of the transistor.

Note that in FIG. 3A, the switching element 401 includes only one transistor; however, the present invention is not limited to this structure. In one embodiment of the present invention, the switching element 401 may include a plurality of transistors. In the case where the switching element 401 includes a plurality of transistors which serve as switching elements, the plurality of transistors may be electrically connected in parallel, in series, or in combination of parallel connection and series connection.

Figure 3B:
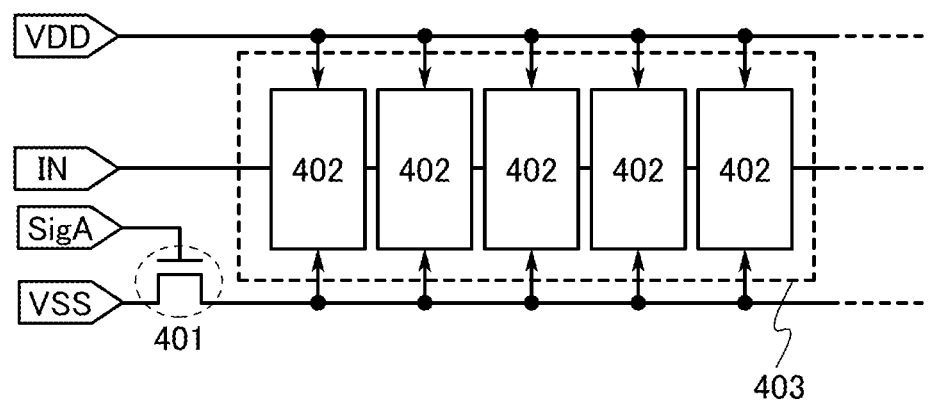

Although the switching element 401 controls supply of the high power supply potential VDD to each of the storage elements 402 included in the storage element group 403 in FIG. 3A, the switching element 401 may control supply of the low power supply potential VSS. FIG. 3B illustrates an example of a storage device in which the low power supply potential VSS is supplied to each of the storage elements 402 included in the storage element group 403 through the switching element 401. The switching element 401 can control the supply of the low power supply potential VSS to each of the storage elements 402 included in the storage element group 403.

Note that when at least one of the high power supply potential and the low power supply potential is not supplied, such a case can be regarded as the case where the power supply voltage of the storage element is not supplied (the power supply voltage of the storage element is 0 V). For example, by making the high power supply potential equal to the low power supply potential, it is possible not to supply power supply voltage (it is possible to set power supply voltage to 0 V). For example, by setting both of the high power supply potential and the low power supply potential to a ground potential, it is possible not to supply power supply voltage (it is possible to set power supply voltage to 0 V).

This embodiment can be combined with any of the above embodiments as appropriate.

(Embodiment 3)

In this embodiment, the structure of a signal processing circuit including the storage element in Embodiment 1 or the storage device in Embodiment 2 is described.

Figure 4:
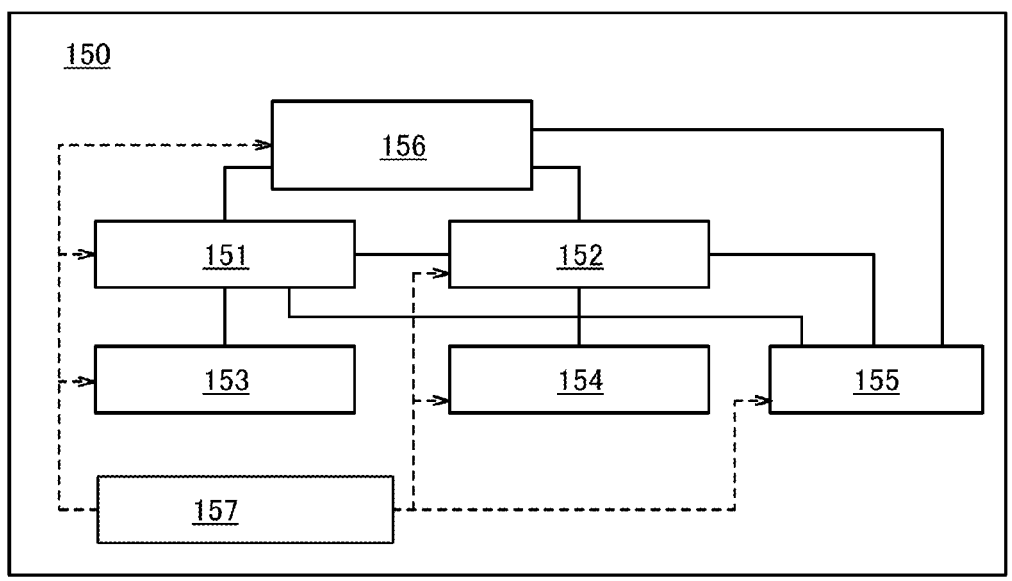
FIG. 4 is a block diagram of a signal processing circuit.

FIG. 4 illustrates an example of a signal processing circuit in one embodiment of the present invention. The signal processing circuit includes at least one or more arithmetic circuits and one or more storage devices (e.g., registers or main memories). Specifically, a signal processing circuit 150 in FIG. 4 includes an arithmetic circuit 151, an arithmetic circuit 152, a register 153, a register 154, a main memory 155, a control device 156, and a power supply control circuit 157.

The arithmetic circuits 151 and 152 each include an adder, a multiplier, and a variety of arithmetic circuits in addition to a logic circuit which performs a simple logical operation. The register 153 is a storage device for temporarily retaining data when the logical operation is performed in the arithmetic circuit 151. The register 154 is a storage device for temporarily retaining data when the logical operation is performed in the arithmetic circuit 152.

In addition, the main memory 155 can store a program executed by the control device 156 as data or can store data from the arithmetic circuit 151 and the arithmetic circuit 152.

The control device 156 is a circuit which collectively controls operations of the arithmetic circuit 151, the arithmetic circuit 152, the register 153, the register 154, and the main memory 155 included in the signal processing circuit 150. Note that in FIG. 4, the control device 156 is provided as part of the signal processing circuit 150; however, the control device 156 may be provided outside the signal processing circuit 150.

With the use of the storage element in Embodiment 1 or the storage device in Embodiment 2 for the register 153, the register 154, and the main memory 155, data can be retained even after supply of power supply voltage to the register 153, the register 154, and the main memory 155 is stopped. Thus, supply of power supply voltage to the entire signal processing circuit 150 is stopped, so that power consumption can be reduced. Alternatively, supply of power supply voltage to one or more of the register 153, the register 154, and the main memory 155 is stopped, so that the power consumption of the signal processing circuit 150 can be reduced. In addition, after the supply of power supply voltage is restarted, the storage element can return to the state before the supply of power supply voltage is stopped in a short time.

In addition, as well as supply of power supply voltage to the storage device (e.g., the register 153, the register 154, or the main memory 155), supply of power supply voltage to the control circuit or the arithmetic circuit which transmits and receives data to and from the storage device may be stopped. For example, when the arithmetic circuit 151 and the register 153 do not operate, supply of power supply voltage to the arithmetic circuit 151 and the register 153 may be stopped.

The power supply control circuit 157 controls the level of power supply voltage which is supplied to the arithmetic circuit 151, the arithmetic circuit 152, the register 153, the register 154, the main memory 155, and the control device 156 included in the signal processing circuit 150. Further, in the case where the supply of power supply voltage is stopped, a switching element for stopping the supply of power supply voltage may be provided for the power supply control circuit 157 or may be provided for each of the arithmetic circuit 151, the arithmetic circuit 152, the register 153, the register 154, the main memory 155, and the control device 156. In the latter case, the power supply control circuit 157 is not necessarily provided in the signal processing circuit of the present invention.

A storage device which functions as a cache memory may be provided between the main memory 155 and at least one of the arithmetic circuit 151, the arithmetic circuit 152, and the control device 156. By provision of the cache memory, low-speed access to the main memory can be reduced and the speed of signal processing such as arithmetic processing can be made higher. By application of the storage element to the storage device functioning as a cache memory, the power consumption of the signal processing circuit 150 can be reduced. In addition, after the supply of power supply voltage is restarted, the storage element can return to the state before the supply of power supply voltage is stopped in a short time.

This embodiment can be combined with any of the above embodiments as appropriate.

(Embodiment 4)

In this embodiment, the structure of a CPU that is one of signal processing circuits according to one embodiment of the present invention is described.

Figure 5:
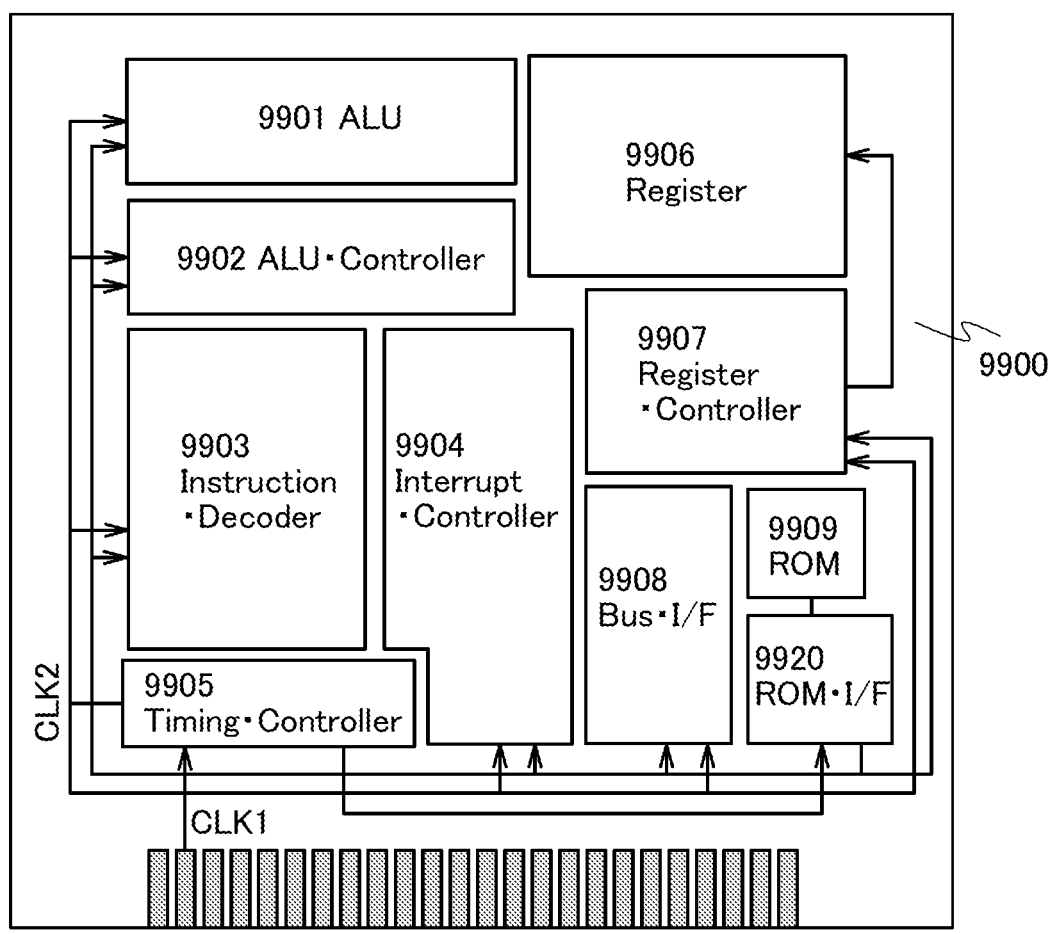
FIG. 5 is a block diagram of a CPU.

FIG. 5 illustrates the structure of a CPU in this embodiment. The CPU in FIG. 5 mainly includes an arithmetic logic unit (ALU) 9901, an ALU controller 9902, an instruction decoder 9903, an interrupt controller 9904, a timing controller 9905, a register 9906, a register controller 9907, a bus interface (bus I/F) 9908, a rewritable ROM 9909, and a ROM interface (ROM I/F) 9920, over a substrate 9900. Further, the ROM 9909 and the ROM OF 9920 may be provided over different chips. Needless to say, the CPU in FIG. 5 is just an example in which the structure is simplified, and an actual CPU may have a variety of structures depending on the uses.

An instruction which is input to the CPU through the bus OF 9908 is input to the instruction decoder 9903 and decoded therein, and then input to the ALU controller 9902, the interrupt controller 9904, the register controller 9907, and the timing controller 9905.

The ALU controller 9902, the interrupt controller 9904, the register controller 9907, and the timing controller 9905 conduct various controls on the basis of the decoded instruction. Specifically, the ALU controller 9902 generates signals for controlling the operation of the ALU 9901. During execution of the program of the CPU, the interrupt controller 9904 judges an interrupt request from an external input/output device or a peripheral circuit based on its priority or a masked state, and processes the request. The register controller 9907 generates an address of the register 9906 and reads and writes data from and to the register 9906 in accordance with the state of the CPU.

The timing controller 9905 generates signals for controlling the operation timing of the ALU 9901, the ALU controller 9902, the instruction decoder 9903, the interrupt controller 9904, and the register controller 9907. For example, the timing controller 9905 includes an internal clock generator for generating an internal clock signal CLK2 on the basis of a reference clock signal CLK1 and supplies the clock signal CLK2 to the circuits.

In the CPU of this embodiment, the storage element 100 whose structure is described with reference to FIG. 1 in the above embodiment is provided in the register 9906. The register controller 9907 determines whether data is retained by the feedback loop of the phase inverter 101 and the phase inverter 102 or data is retained in the capacitor 108 in the storage element 100 included in the register 9906 on the basis of an instruction from the ALU 9901. When data retention by the feedback loop of the phase inverter 101 and the phase inverter 102 is selected, power supply voltage is supplied to the storage element 100 in the register 9906. When data retention in the capacitor 108 is selected, the supply of power supply voltage to the storage element 100 in the register 9906 can be stopped. The supply of power supply voltage can be stopped by provision of a switching element between a storage element group and a node to which a high power supply potential or a low power supply potential is supplied, as illustrated in FIG. 3A or FIG. 3B.

In this manner, even in the case where the operation of the CPU is temporarily stopped and the supply of power supply voltage is stopped, data can be retained and power consumption can be reduced. Specifically, for example, while the user of a personal computer stops input of data to an input device such as a keyboard, the operation of the CPU can be stopped, so that the power consumption can be reduced.

Although the CPU is described as an example in this embodiment, the signal processing circuit of the present invention is not limited to the CPU and can be applied to an LSI such as a microprocessor, an image processing circuit, a DSP, or an FPGA.

This embodiment can be combined with any of the above embodiments as appropriate.

(Embodiment 5)

In this embodiment, an example in which a system using a CPU is used as a signal processing circuit is described.

Figure 16:
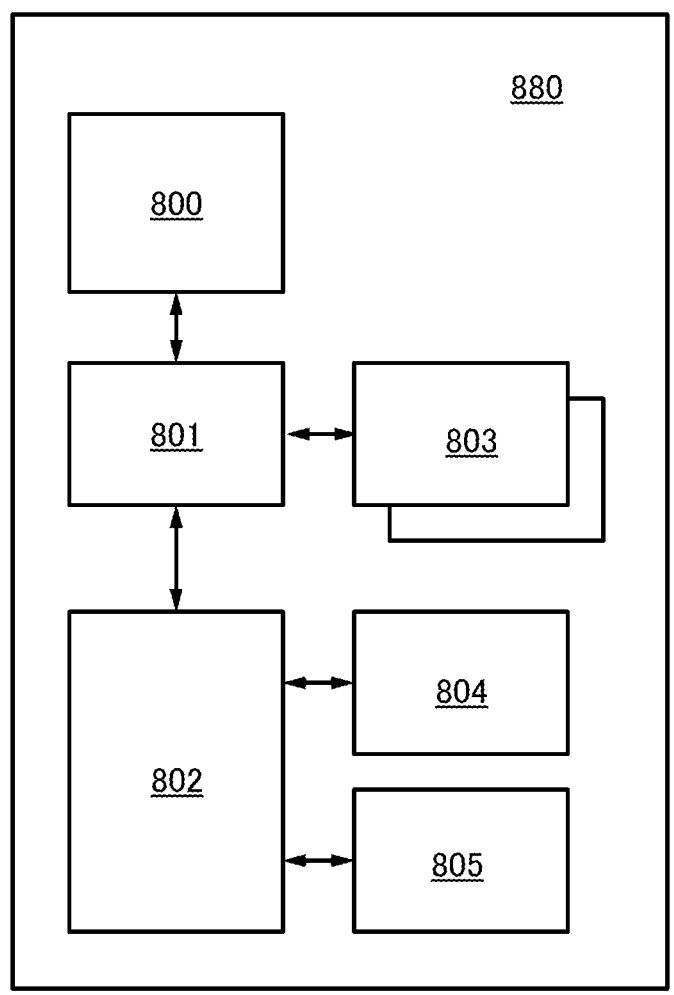
FIG. 16 is a block diagram illustrating the structure of a system using a CPU.

FIG. 16 illustrates a system that includes a CPU, a peripheral control device, and a peripheral device as an example of a system using a CPU (a PC system). In FIG. 16, a PC system 880 includes a CPU 800, a northbridge 801 and a southbridge 802 as peripheral control devices, a main memory 803 and a hard disk 804 as peripheral devices, and a different peripheral device 805. Examples of the different peripheral device 805 include a PCI device, a network device, an audio device, and the like. Data input and data output are performed in these devices as represented by arrows in FIG. 16. Note that instead of the structure in FIG. 16, the system using a CPU can have a structure where one peripheral control device is obtained by a combination of a northbridge and a southbridge or a structure where peripheral control devices are put together.

The peripheral control device (e.g., the northbridge 801 or the southbridge 802) in the PC system 880 includes a control register (also referred to as a storage device), and setting data in the peripheral device (e.g., the main memory 803, the hard disk 804, or the different peripheral device 805) is stored in the control register. For example, in the case where a dynamic random access memory (DRAM) is used as the main memory 803, setting data of the specification of the DRAM (e.g., memory capacity, a clock frequency, or memory latency (a delay time from data access to data output) is stored in the control register. In other words, by a change in setting data of the control register, a DRAM with a different specification can be used. When the peripheral control device has the above function, the structure of the peripheral device in the PC system can be changed with flexibility.

Setting data to be stored in the control register is stored in, for example, a configuration ROM (also referred to as a storage device) or the like mounted on the DRAM used as the main memory 803. The setting data is read from the configuration ROM when the power supply voltage of the PC system is input, and is stored in the control register of the peripheral control device.

The access from the peripheral control device to the peripheral device is slow; thus, it takes an extremely long time to store setting data in the control register. Further, an increase in the number of peripheral devices leads to an increase in a storage time of setting data.

In one aspect of a system using a CPU of the present invention, the storage element 100 described in any of the other embodiments is used in the control register in the peripheral control device (e.g., the northbridge 801 or the southbridge 802). In the control register including the storage element 100, data can be retained even when power supply voltage is not supplied. Thus, after supply of power supply voltage to the peripheral control device is stopped, it is not necessary to set the control register in the peripheral control device when the supply of power supply voltage is restarted. Consequently, the time to set the control register is not needed, and the state can be quickly returned to the state before the supply of power supply voltage is stopped after the supply of power supply voltage to the peripheral control device is restarted. Accordingly, the supply of power supply voltage to the peripheral control device can be stopped even for a short time, so that it is possible to provide the PC system 880 whose power consumption can be reduced.

In one aspect of the system using a CPU of the present invention, the storage element 100 described in any of the other embodiments is used in each of the CPU 800, the northbridge 801, the southbridge 802, the main memory 803, the hard disk 804, and the different peripheral device 805. The storage element 100 can retain data even when power supply voltage is not supplied. Thus, the CPU 800, the northbridge 801, the southbridge 802, the main memory 803, the hard disk 804, and the different peripheral device 805 can retain data even when power supply voltage is not supplied. In the case where the number of processings to be performed by the CPU is small in this manner, supply of power supply voltage to the entire PC system 880 is stopped, so that the power consumption of the entire PC system 880 can be reduced. In particular, with the use of the storage element 100 not only in the CPU 800 but also in the control register in the peripheral control device (e.g., the northbridge 801 or the southbridge 802) as described above, the state can be quickly returned to the state before the supply of power supply voltage is stopped. Accordingly, the supply of power supply voltage to the PC system 880 can be stopped even for a short time, so that it is possible to provide the PC system 880 whose power consumption can be reduced.

This embodiment can be combined with any of the above embodiments as appropriate.

(Embodiment 6)

A method for forming the storage element 100 in FIG. 1 when the phase inverter 101 and the phase inverter 102 include transistors is described. The transistor included in the phase inverter 102 is a transistor whose channel is formed using silicon. In addition, of the transistors included in the phase inverter 102, a transistor whose other of a source and a drain and whose gate are electrically connected to each other is a transistor 110. In this embodiment, the method for forming the storage element 100 is described giving the transistor 110, the transistor 109, and the capacitor 108 as an example. Note that other elements included in the storage element 100 can be formed as in the transistor 109, the transistor 110, and the capacitor 108.

Figure 6A:
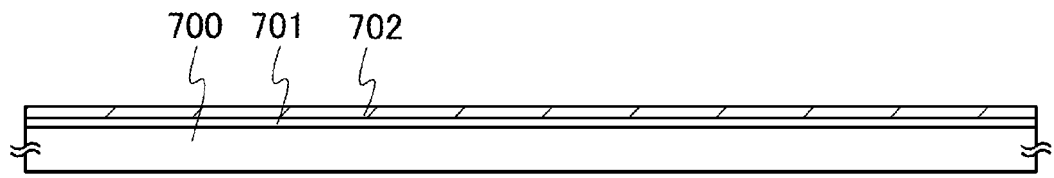
FIGS. 6A to 6D are cross-sectional views illustrating steps of forming a storage element.

As illustrated in FIG. 6A, an insulating film 701 and a semiconductor film 702 that is separated from a single crystal semiconductor substrate are formed over a substrate 700.

Although there is no particular limitation on a material which can be used as the substrate 700, it is necessary that the material have at least heat resistance high enough to withstand heat treatment to be performed later. For example, a glass substrate formed by a fusion process or a float process, a quartz substrate, a semiconductor substrate, a ceramic substrate, or the like can be used as the substrate 700. In the case where the temperature of the heat treatment to be performed later is high, a glass substrate whose strain point is 730° C. or higher is preferably used as a glass substrate.

In this embodiment, an example in which the semiconductor film 702 is formed using single crystal silicon is given below as the method for forming the transistor 110. Note that a specific example of a method for forming the single crystal semiconductor film 702 is briefly described. First, an ion beam including ions which are accelerated by an electric field enters a bond substrate which is the single crystal semiconductor substrate and a fragile layer which is fragile because of local disorder of the crystal structure is formed in a region at a certain depth from a surface of the bond substrate. The depth at which the fragile layer is formed can be adjusted by the acceleration energy of the ion beam and the angle at which the ion beam enters. Then, the bond substrate and the substrate 700 which is provided with the insulating film 701 are attached to each other so that the insulating film 701 is sandwiched therebetween. After the bond substrate and the substrate 700 overlap with each other, a pressure of approximately 1 to 500 N/cm$^2$, preferably 11 to 20 N/cm$^2$ is applied to part of the bond substrate and part of the substrate 700 so that the substrates are attached to each other. When the pressure is applied to part of the bond substrate and part of the substrate 700, bonding between the bond substrate and the insulating film 701 starts from the parts, which results in bonding of the entire surface where the bond substrate and the insulating film 701 are in close contact with each other. After that, heat treatment is performed, so that microvoids that exist in the fragile layer are combined, and the volume of the microvoids is increased. Accordingly, a single crystal semiconductor film which is part of the bond substrate is separated from the bond substrate along the fragile layer. The temperature of the heat treatment is set so as not to exceed the strain point of the substrate 700. Then, the single crystal semiconductor film is processed into a desired shape by etching or the like, so that the semiconductor film 702 can be formed.

In order to control the threshold voltage, an impurity element imparting p-type conductivity, such as boron, aluminum, or gallium, or an impurity element imparting n-type conductivity, such as phosphorus or arsenic, may be added to the semiconductor film 702. An impurity element for controlling the threshold voltage may be added to the semiconductor film which is not etched to have a predetermined shape or may be added to the semiconductor film 702 which is etched to have a predetermined shape. Alternatively, the impurity element for controlling the threshold voltage may be added to the bond substrate. Alternatively, the impurity element may be added to the bond substrate in order to roughly control the threshold voltage, and the impurity element may be further added to the semiconductor film which is not etched to have a predetermined shape or the semiconductor film 702 which is etched to have a predetermined shape in order to finely control the threshold voltage.

Note that although the single crystal semiconductor film is used in this embodiment, the present invention is not limited to this structure. For example, a polycrystalline, microcrystalline, or amorphous semiconductor film which is formed over the insulating film 701 by vapor deposition may be used. Alternatively, the semiconductor film may be crystallized by a known technique. As a known crystallization technique, laser crystallization using a laser beam or crystallization using a catalytic element can be used. Alternatively, crystallization using a catalytic element and laser crystallization can be used in combination. When a heat-resistant substrate such as a quartz substrate is used, crystallization combined with thermal crystallization using an electrically heated oven, lamp heating crystallization using infrared light, crystallization using a catalytic element, or high-temperature heating at approximately 950° C. may be used.

Figure 6B:
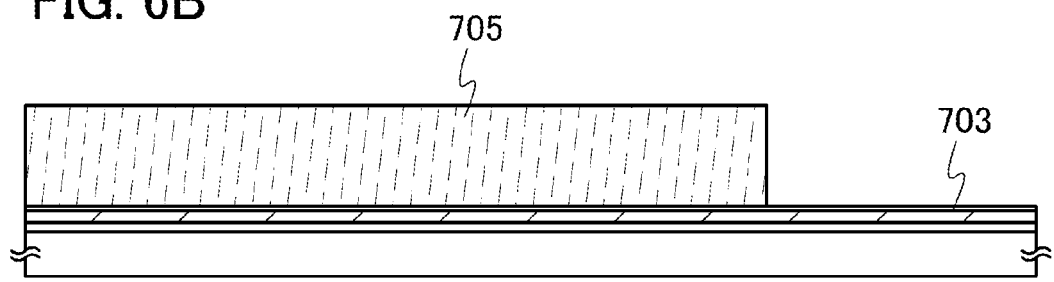

Next, as illustrated in FIG. 6B, a gate insulating film 703 is formed over the semiconductor film 702.

The gate insulating film 703 can be formed by oxidation or nitriding of a surface of the semiconductor film 702 by high-density plasma treatment, heat treatment, or the like. The high-density plasma treatment is performed using, for example, a mixed gas of a rare gas such as He, Ar, Kr, or Xe; and oxygen, nitrogen oxide, ammonia, nitrogen, hydrogen, or the like. In that case, when plasma is excited by introduction of microwaves, plasma with a low electron temperature and high density can be generated. By oxidation or nitriding of the surface of the semiconductor film with oxygen radicals (including OH radicals in some cases) or nitrogen radicals (including NH radicals in some cases) generated by such high-density plasma, an insulating film with a thickness of 1 to 20 nm, preferably 5 to 10 nm can be formed to be in contact with the semiconductor film. For example, nitrous oxide (N$_2$O) is diluted with Ar by 1 to 3 times (flow rate) and a microwave (2.45 GHz) electric power of 3 to 5 kW is applied with a pressure of 10 to 30 Pa so that the oxidation or nitriding of the surface of the semiconductor film 702 is performed. By this treatment, an insulating film with a thickness of 1 to 10 nm (preferably 2 to 6 nm) is formed. Further, nitrous oxide (N$_2$O) and silane (SiH$_4$) are introduced and a microwave (2.45 GHz) electric power of 3 to 5 kW is applied with a pressure of 10 to 30 Pa so that a silicon oxynitride film is formed by vapor deposition, thereby forming a gate insulating film. With a combination of solid-phase reaction and vapor deposition, a gate insulating film having low interface state density and high withstand voltage can be formed.

The oxidation or nitriding of the semiconductor film by the high-density plasma treatment proceeds by solid-phase reaction. Thus, interface state density between the gate insulating film 703 and the semiconductor film 702 can be extremely low. Further, by direct oxidation or nitriding of the semiconductor film 702 by high-density plasma treatment, variation in the thickness of the insulating film to be formed can be suppressed. Further, in the case where the semiconductor film has crystallinity, by oxidation of the surface of the semiconductor film by solid-phase reaction by high-density plasma treatment, crystal grain boundaries can be prevented from being locally oxidized at fast speed. Thus, a uniform gate insulating film with low interface state density can be formed. Variations in the characteristics of a transistor whose gate insulating film partly or entirely includes an insulating film formed by high-density plasma treatment can be suppressed.

The gate insulating film 703 may be formed using a single layer or a stack of layers of a film including silicon oxide, silicon nitride oxide, silicon oxynitride, silicon nitride, hafnium oxide, aluminum oxide, tantalum oxide, yttrium oxide, hafnium silicate (HfSi$_x$O$_y$, (x>0, y>0)), hafnium silicate (HfSi$_x$O$_y$, (x>0, y>0)) to which nitrogen is added, hafnium aluminate (HfAl$_x$O$_y$, (x>0, y>0)) to which nitrogen is added, or the like by plasma-enhanced CVD, sputtering, or the like.

Note that in this specification, an oxynitride is a substance which includes more oxygen than nitrogen, and a nitride oxide is a substance which includes more nitrogen than oxygen.

The thickness of the gate insulating film 703 can be, for example, 1 to 100 nm, preferably 10 to 50 nm. In this embodiment, a single-layer insulating film containing silicon oxide is formed as the gate insulating film 703 by plasma-enhanced CVD.

Next, as illustrated in FIG. 6B, a mask 705 is formed over the gate insulating film 703. Then, as illustrated in FIG. 6C, etching is performed using the mask 705, so that a semiconductor layer 772 and a gate insulating layer 773 are formed.

Figure 6C:
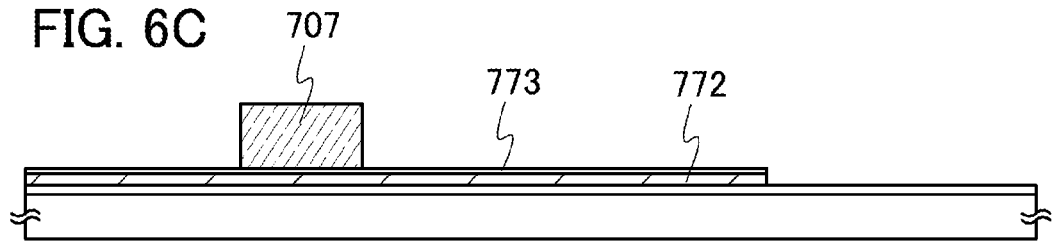

Then, after the mask 705 is removed, as illustrated in FIG. 6C, a gate electrode 707 is formed.

A conductive film is formed and then is etched to have a predetermined shape, so that the gate electrode 707 can be formed. The conductive film can be formed by CVD, sputtering, vapor deposition, spin coating, or the like. For the conductive film, tantalum (Ta), tungsten (W), titanium (Ti), molybdenum (Mo), aluminum (Al), copper (Cu), chromium (Cr), niobium (Nb), or the like can be used. An alloy containing the metal as its main component or a compound containing the metal may be used. Alternatively, the conductive film may be formed using a semiconductor such as polycrystalline silicon doped with an impurity element such as phosphorus which imparts conductivity to the semiconductor film.

Note that although the gate electrode 707 is formed using a single-layer conductive film in this embodiment, this embodiment is not limited to this structure. The gate electrode 707 may be formed using a plurality of stacked conductive films.

As a combination of two conductive films, tantalum nitride or tantalum can be used for a first conductive film and tungsten can be used for a second conductive film. As well as the example, any of the following combination can be used: tungsten nitride and tungsten; molybdenum nitride and molybdenum; aluminum and tantalum; aluminum and titanium; and the like. Since tungsten and tantalum nitride have high heat resistance, heat treatment for thermal activation can be performed in a step performed after the two conductive films are formed. Alternatively, as the combination of the two conductive films, for example, nickel silicide and silicon doped with an impurity element which imparts n-type conductivity, tungsten silicide and silicon doped with an impurity element which imparts n-type conductivity, or the like can be used.

In the case of a three-layer structure in which three conductive films are stacked, a layered structure of a molybdenum film, an aluminum film, and a molybdenum film is preferably used.

A light-transmitting oxide conductive film of indium oxide, indium oxide-tin oxide, indium oxide-zinc oxide, zinc oxide, zinc aluminum oxide, zinc aluminum oxynitride, zinc gallium oxide, or the like can be used as the gate electrode 707.

Alternatively, the gate electrode 707 may be selectively formed by a droplet discharge method without the use of a mask. A droplet discharge method is a method for forming a predetermined pattern by discharge or ejection of a droplet containing a predetermined composition from an orifice, and includes an inkjet method or the like in its category.

In addition, the gate electrode 707 may be formed by forming a conductive film, and the conductive film is etched by inductively coupled plasma (ICP) etching under appropriately controlled conditions (e.g., the amount of electric power applied to a coiled electrode layer, the amount of electric power applied to an electrode layer on the substrate side, and the electrode temperature on the substrate side) to have a desired tapered shape. Further, an angle and the like of the tapered shape may be controlled by the shape of a mask. Note that for an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 6D:
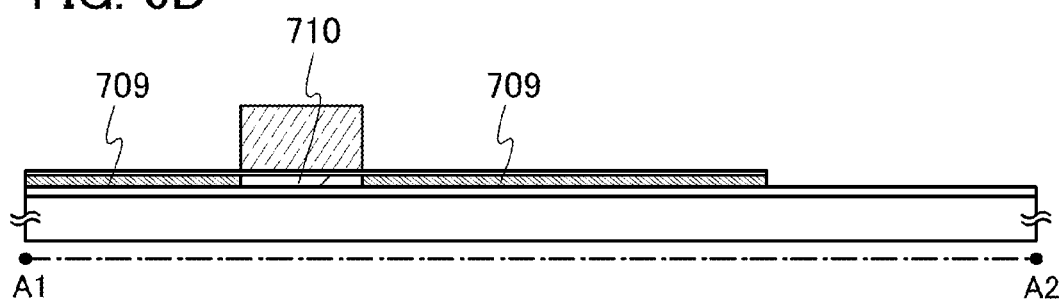

Next, as illustrated in FIG. 6D, when an impurity element which imparts one conductivity is added to the semiconductor layer 772 with the gate electrode 707 used as a mask, a channel formation region 710 overlapping with the gate electrode 707 and a pair of impurity regions 709 sandwiching the channel formation region 710 are formed in the semiconductor layer 772.

In this embodiment, the case where an impurity element which imparts p-type conductivity (e.g., boron) is added to the semiconductor layer 772 is described.

Figure 7A:
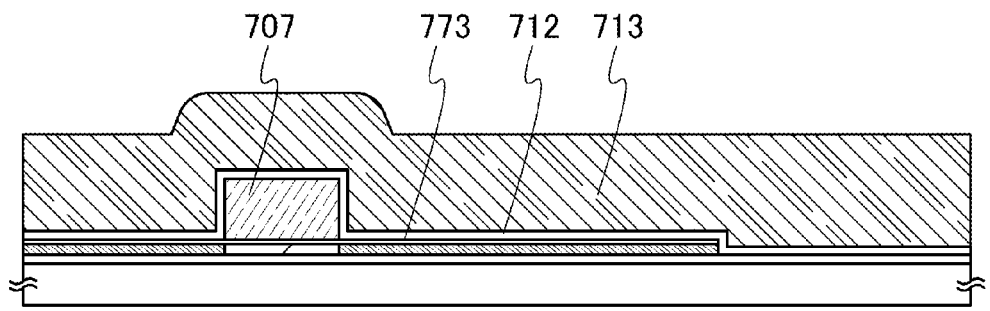
FIGS. 7A to 7C are cross-sectional views illustrating steps of forming the storage element.

Next, as illustrated in FIG. 7A, insulating films 712 and 713 are formed to cover the gate insulating layer 773 and the gate electrode 707. Specifically, an inorganic insulating film of silicon oxide, silicon nitride, silicon nitride oxide, silicon oxynitride, aluminum nitride, aluminum nitride oxide, or the like can be used as the insulating films 712 and 713. In particular, the insulating films 712 and 713 are preferably formed using a low dielectric constant (low-k) material because capacitance due to overlapping of electrodes or wirings can be sufficiently reduced. Note that a porous insulating film including such a material may be employed as the insulating films 712 and 713. Since the porous insulating film has lower dielectric constant than a dense insulating layer, parasitic capacitance due to electrodes or wirings can be further reduced.

In this embodiment, an example in which silicon oxynitride is used for the insulating film 712 and silicon nitride oxide is used for the insulating film 713 is described. In addition, in this embodiment, although an example in which the insulating films 712 and 713 are formed over the gate electrode 707, in the present invention, only one insulating film may be formed over the gate electrode 707, or a plurality of insulating films of three or more layers may be stacked.

Figure 7B:
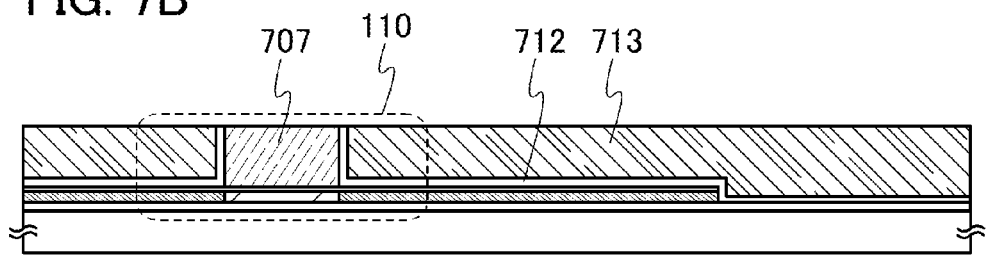

Next, as illustrated in FIG. 7B, the insulating films 712 and 713 are subjected to chemical mechanical polishing (CMP) or etching, so that a surface of the gate electrode 707 is exposed. Note that in order to improve the characteristics of the transistor 109 which is formed later, surfaces of the insulating films 712 and 713 are preferably flattened as much as possible.

Through the above steps, the transistor 110 can be formed.

Figure 7C:
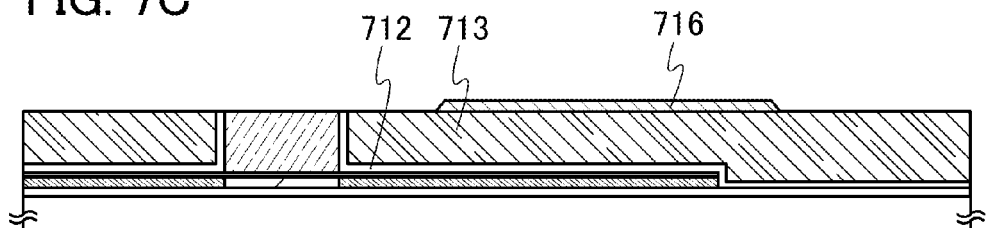

Next, a method for forming the transistor 109 is described. First, as illustrated in FIG. 7C, an oxide semiconductor layer 716 is formed over the insulating film 712 or the insulating film 713.

The oxide semiconductor layer 716 can be formed by processing an oxide semiconductor film formed over the insulating films 712 and 713 into a desired shape. The thickness of the oxide semiconductor film is 2 to 200 nm, preferably 3 to 50 nm, more preferably 3 to 20 nm. The oxide semiconductor film is deposited by sputtering using an oxide semiconductor as a target. Alternatively, the oxide semiconductor film can be formed by sputtering in a rare gas (e.g., argon) atmosphere, an oxygen atmosphere, or a mixed atmosphere of a rare gas (e.g., argon) and oxygen.

Note that before the oxide semiconductor film is deposited by sputtering, dust on surfaces of the insulating films 712 and 713 is preferably removed by reverse sputtering in which an argon gas is introduced and plasma is generated. The reverse sputtering is a method in which, without application of voltage to a target side, an RF power source is used for application of voltage to a substrate side in an argon atmosphere and plasma is generated in the vicinity of the substrate so that a substrate surface is modified. Note that nitrogen, helium, or the like may be used instead of the argon atmosphere. Alternatively, an argon atmosphere to which oxygen, nitrous oxide, or the like is added may be used. Alternatively, an argon atmosphere to which chlorine, carbon tetrafluoride, or the like is added may be used.

For the oxide semiconductor film, a four-component metal oxide such as an In—Sn—Ga—Zn-based oxide semiconductor; a three-component metal oxide such as an In—Ga—Zn-based oxide semiconductor, an In—Sn—Zn-based oxide semiconductor, an In—Al—Zn-based oxide semiconductor, a Sn—Ga—Zn-based oxide semiconductor, an Al—Ga—Zn-based oxide semiconductor, or a Sn—Al—Zn-based oxide semiconductor; a two-component metal oxide such as an In—Zn-based oxide semiconductor, a Sn—Zn-based oxide semiconductor, an Al—Zn-based oxide semiconductor, a Zn—Mg-based oxide semiconductor, a Sn—Mg-based oxide semiconductor, an In—Mg-based oxide semiconductor, or an In—Ga-based oxide semiconductor; a single-component metal oxide such as indium oxide, tin oxide, or zinc oxide; or the like can be used.

In this embodiment, a 30-nm-thick In—Ga—Zn-based oxide semiconductor thin film which is obtained by sputtering using a target including indium (In), gallium (Ga), and zinc (Zn) is used as the oxide semiconductor film. A target with a composition ratio of metals, In:Ga:Zn=1:1:0.5, In:Ga:Zn=1:1:1, or In:Ga:Zn=1:1:2 can be used as the target, for example. The filling rate of the target including In, Ga, and Zn is higher than or equal to 90% and lower than or equal to 100%, preferably higher than or equal to 95% and lower than 100%. With the use of the target with a high filling rate, a dense oxide semiconductor film is formed.

Note that in the case where the oxide semiconductor film is formed using a target including indium (In) and zinc (Zn), the atomic ratio of the target is In/Zn=0.5 to 50, preferably 1 to 20, more preferably 1.5 to 15. The mobility can be improved by keeping the ratio of Zn within the above range.

In this embodiment, the oxide semiconductor film is deposited in such a manner that the substrate is held in a treatment chamber kept in a reduced pressure state, moisture remaining in the treatment chamber is removed, a sputtering gas from which hydrogen and moisture are removed is introduced, and the target is used. The substrate temperature may be 100 to 600° C., preferably 200 to 400° C. during deposition. By deposition of the oxide semiconductor film while the substrate is heated, the concentration of impurities included in the deposited oxide semiconductor film can be lowered. In addition, damage by sputtering can be reduced. In order to remove moisture remaining in the treatment chamber, an adsorption vacuum pump is preferably used. For example, a cryopump, an ion pump, or a titanium sublimation pump is preferably used. A turbo pump to which a cold trap is added may be used as an exhaustion means. For example, a hydrogen atom, a compound containing a hydrogen atom, such as water (preferably a compound containing a carbon atom), and the like are exhausted from the treatment chamber with the use of a cryopump. Thus, the concentration of impurities contained in the oxide semiconductor film deposited in the treatment chamber can be lowered.

As an example of the deposition condition, the following condition is employed: the distance between the substrate and the target is 100 mm, the pressure is 0.6 Pa, the direct current (DC) power is 0.5 kW, and the atmosphere is an oxygen atmosphere (the proportion of the oxygen flow rate is 100%). Note that it is preferable that pulsed direct-current (DC) power be used because dust generated during deposition can be reduced and the film thickness can be uniform.

Further, when the leakage rate of the treatment chamber of the sputtering apparatus is set lower than or equal to $1\times10^{-10}$ Pa·m$^3$/s, entry of impurities such as alkali metal or hydride into the oxide semiconductor film that is being formed by sputtering can be reduced. Furthermore, with the use of the adsorption vacuum pump as an evacuation system, counter flow of impurities such as alkali metal, a hydrogen atom, a hydrogen molecule, water, a hydroxyl group, or hydride from the evacuation system can be reduced.

When the purity of the target is set to 99.99% or higher, alkali metal, a hydrogen atom, a hydrogen molecule, water, a hydroxyl group, hydride, or the like mixed into the oxide semiconductor film can be reduced. In addition, with the use of the target, the concentration of an alkali metal such as lithium, sodium, or potassium can be reduced in the oxide semiconductor film.

Note that in order that hydrogen, a hydroxyl group, and moisture be contained in the oxide semiconductor film as little as possible, it is preferable that an impurity such as hydrogen or moisture that is adsorbed on the substrate 700 be eliminated and exhausted by preheating of the substrate 700 over which the insulating films 712 and 713 are formed in a preheating chamber of a sputtering apparatus, as pretreatment for deposition. The temperature of the preheating is 100 to 400° C., preferably 150 to 300° C. As an exhaustion means provided in the preheating chamber, a cryopump is preferable. Note that the preheating treatment can be omitted. This preheating may be similarly performed on the substrate 700 over which conductive films 719 and 720 are formed before the formation of a gate insulating film 721.

Note that etching for forming the oxide semiconductor layer 716 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching, parallel plate reactive ion etching (RIE) or inductively coupled plasma (ICP) etching can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, organic acid such as citric acid or oxalic acid, or the like can be used. In this embodiment, ITO-07N (produced by KANTO CHEMICAL CO., INC.) is used.

A resist mask for forming the oxide semiconductor layer 716 may be formed by an inkjet method. When the resist mask is formed by an inkjet method, a photomask is not used; thus, manufacturing cost can be reduced.

Note that it is preferable that reverse sputtering be performed before the formation of a conductive film in a subsequent step so that resist residues and the like that attach onto surfaces of the oxide semiconductor layer 716 and the insulating films 712 and 713 are removed.

Note that the oxide semiconductor film deposited by sputtering or the like contains a large amount of moisture or hydrogen (including a hydroxyl group) as an impurity in some cases. Moisture or hydrogen easily forms a donor level and thus serve as an impurity in the oxide semiconductor. Thus, in one embodiment of the present invention, in order to reduce impurities such as moisture or hydrogen in the oxide semiconductor film (in order to perform dehydration or dehydrogenation), the oxide semiconductor layer 716 is subjected to heat treatment in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or less, preferably 1 ppm or less, more preferably 10 ppb or less, in the case where measurement is performed by a dew point meter in a cavity ring down laser spectroscopy (CRDS) method).

By performing heat treatment on the oxide semiconductor layer 716, moisture or hydrogen in the oxide semiconductor layer 716 can be eliminated. Specifically, heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately 3 to 6 minutes. When RTA is used for the heat treatment, dehydration or dehydrogenation can be performed in a short time; thus, treatment can be performed even at a temperature higher than the strain point of a glass substrate.

In this embodiment, an electric furnace that is one of heat treatment apparatuses is used.

Note that the heat treatment apparatus is not limited to an electric furnace, and may be provided with a device for heating an object by thermal conduction or thermal radiation from a heater such as a resistance heater. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. An inert gas which does not react with an object by heat treatment, such as nitrogen or a rare gas (e.g., argon), is used as the gas.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

Note that it has been pointed out that an oxide semiconductor is insensitive to impurities, there is no problem when a considerable amount of metal impurities is contained in the film, and soda-lime glass which contains a large amount of alkali metal such as sodium and is inexpensive can be used (Kamiya, Nomura, and Hosono, "Carrier Transport Properties and Electronic Structures of Amorphous Oxide Semiconductors: The present status", *KOTAI BUTSURI (SOLID STATE PHYSICS)*, 2009, Vol. 44, pp. 621-633). But such consideration is not appropriate. Alkali metal is not an element included in an oxide semiconductor and thus is an impurity. Alkaline earth metal is also an impurity in the case where alkaline earth metal is not included in an oxide semiconductor. Alkali metal, in particular, Na becomes Na$^+$ when an insulating film which is in contact with an oxide semiconductor layer is an oxide and Na diffuses into the insulating film. In addition, in the oxide semiconductor layer, Na cuts or enters a bond between metal and oxygen which are included in an oxide semiconductor. As a result, for example, deterioration of characteristics of a transistor, such as a normally-on state of the transistor due to shift of the threshold voltage in a negative direction, or a decrease in mobility, occurs. Variation in characteristics also occurs. Such deterioration of characteristics of the transistor and variation in characteristics due to the impurity remarkably appear when the concentration of hydrogen in the oxide semiconductor layer is extremely low. Thus, when the concentration of hydrogen in the oxide semiconductor layer is $1\times10^{18}/cm^3$ or lower, preferably $1\times10^{17}/cm^3$ or lower, the concentration of the impurity is preferably lowered. Specifically, the measurement value of a Na concentration by secondary ion mass spectrometry is preferably $5\times10^{16}/cm^3$ or less, more preferably $1\times10^{16}/cm^3$ or less, still more preferably $1\times10^{15}/cm^3$ or less. Similarly, the measurement value of a Li concentration is preferably $5\times10^{15}/cm^3$ or less, more preferably $1\times10^{15}/cm^3$ or less. Similarly, the measurement value of a K concentration is preferably $5\times10^{15}/cm^3$ or less, more preferably $1\times10^{15}/cm^3$ or less.

Through the above steps, the concentration of hydrogen in the oxide semiconductor layer 716 can be lowered.

Note that the oxide semiconductor layer may be either amorphous or crystalline. In the latter case, the oxide semiconductor layer may be either single crystalline or polycrystalline, may have a structure in which part of the oxide semiconductor layer is crystalline, may have an amorphous structure including a crystalline portion, or may be non-amorphous. For example, as the oxide semiconductor layer, an oxide including a crystal with c-axis alignment (also referred to as c-axis aligned crystal (CAAC)) that has a triangular or hexagonal atomic order when seen from the direction of an a-b plane, a surface, or an interface can be used. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

An oxide semiconductor film including CAAC can be formed by sputtering. In order to obtain CAAC by sputtering, it is important to form hexagonal crystals in an initial stage of deposition of an oxide semiconductor film and to cause crystal growth from the hexagonal crystals as cores. In order to achieve this, it is preferable that the distance between the target and the substrate be made longer (e.g., approximately 150 to 200 mm) and a substrate heating temperature be 100 to 500° C., preferably 200 to 400° C., more preferably 250 to 300° C. In addition, the deposited oxide semiconductor film is subjected to heat treatment at a temperature higher than the substrate heating temperature during the deposition, so that micro defects in the film and defects at the interface of a stacked layer can be repaired.

In a broad sense, an oxide including CAAC means a non-single-crystal including a phase which has a triangular, hexagonal, regular triangular, or regular hexagonal atomic order when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal but this does not mean that the CAAC is composed of only an amorphous component. Although the CAAC includes a crystallized portion (a crystalline portion), a boundary between one crystalline portion and another crystalline portion is not clear in some cases.

In the case where oxygen is included in the CAAC, nitrogen may be substituted for part of oxygen included in the CAAC. The c-axes of crystalline portions included in the CAAC may be aligned in a certain direction (e.g., a direction perpendicular to a surface of a substrate over which the CAAC is formed or a surface of the CAAC). Alternatively, the normals of the a-b planes of the crystalline portions included in the CAAC may be aligned in a certain direction (e.g., a direction perpendicular to a surface of a substrate over which the CAAC is formed or a surface of the CAAC).

The CAAC becomes a conductor, a semiconductor, or an insulator depending on its composition or the like. Further, the CAAC transmits or does not transmit visible light depending on its composition or the like.

As an example of such a CAAC, there is a crystal which is formed into a film shape and has a triangular or hexagonal atomic order when seen from the direction perpendicular to a surface of the film or a surface of a support substrate, and in which metal atoms are arranged in a layered manner or metal atoms and oxygen atoms (or nitrogen atoms) are arranged in a layered manner when a cross section of the film is observed.

Figure 8A:
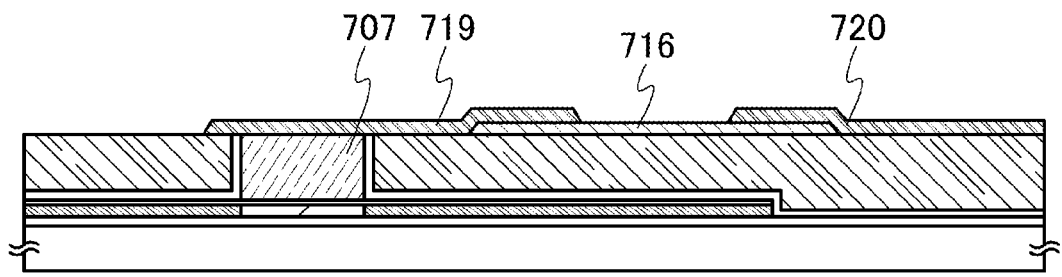
FIGS. 8A to 8C are cross-sectional views illustrating steps of forming the storage element.

Next, as illustrated in FIG. 8A, the conductive film 719 which is in contact with the gate electrode 707 and the oxide semiconductor layer 716 and the conductive film 720 which is in contact with the oxide semiconductor layer 716 are formed. The conductive films 719 and 720 function as a source and drain electrodes.

Specifically, the conductive films 719 and 720 can be formed in such a manner that a conductive film is formed to cover the gate electrode 707 by sputtering or vacuum vapor deposition and then is etched to have a predetermined shape.

As the conductive film which serves as the conductive films 719 and 720, any of the following materials can be used: an element selected from aluminum, chromium, copper, tantalum, titanium, molybdenum, or tungsten; an alloy including any of these elements; an alloy film including the above elements in combination; and the like. Alternatively, a structure may be employed in which a film of a refractory metal such as chromium, tantalum, titanium, molybdenum, or tungsten is stacked over or below a metal film of aluminum, copper, or the like. Aluminum or copper is preferably used in combination with a refractory metal material in order to avoid problems with heat resistance and corrosion. As the refractory metal material, molybdenum, titanium, chromium, tantalum, tungsten, neodymium, scandium, yttrium, or the like can be used.

Further, the conductive film which serves as the conductive films 719 and 720 may have a single-layer structure or a layered structure of two or more layers. For example, a single-layer structure of an aluminum film containing silicon, a two-layer structure in which a titanium film is stacked over an aluminum film, a three-layer structure in which a titanium film, an aluminum film, and a titanium film are stacked in that order, and the like can be given. A Cu—Mg—Al alloy, a Mo—Ti alloy, Ti, and Mo have high adhesion with an oxide film. Thus, for the conductive films 719 and 720, a layered structure is employed in which a conductive film including a Cu—Mg—Al alloy, a Mo—Ti alloy, Ti, or Mo is used for a lower layer and a conductive film including Cu is used for an upper layer. Consequently, the adhesion between an insulating film which is an oxide film and the conductive films 719 and 720 can be increased.

For the conductive film which serves as the conductive films 719 and 720, a conductive metal oxide may be used. As the conductive metal oxide, indium oxide, tin oxide, zinc oxide, indium oxide-tin oxide, indium oxide-zinc oxide, or the conductive metal oxide material containing silicon or silicon oxide can be used.

In the case where heat treatment is performed after the formation of the conductive film, the conductive film preferably has heat resistance high enough to withstand the heat treatment.

Note that each material and etching conditions are adjusted as appropriate so that the oxide semiconductor layer 716 is not removed as much as possible during etching of the conductive film. Depending on the etching conditions, an exposed portion of the oxide semiconductor layer 716 is partly etched, so that a groove (a depression portion) is formed in some cases.

In this embodiment, a titanium film is used as the conductive film. Thus, the conductive film can be selectively etched by wet etching using a solution (an ammonia hydrogen peroxide mixture) containing ammonia and hydrogen peroxide water. Specifically, an ammonia hydrogen peroxide mixture in which oxygenated water of 31 wt %, ammonia water of 28 wt %, and water are mixed at a volume ratio of 5:2:2 is used. Alternatively, dry etching may be performed on the conductive film with the use of a gas containing chlorine ($Cl_2$), boron chloride ($BCl_3$), or the like.

Note that in order to reduce the number of photomasks used in a photolithography process and to reduce the number of processes, an etching process may be performed using a multi-tone mask through which light is transmitted to have a plurality of intensities. A resist mask formed using a multi-tone mask has a plurality of thicknesses and can be changed in shape by etching; thus, the resist mask can be used in a plurality of etching processes for processing films into different patterns. Accordingly, a resist mask corresponding to at least two or more kinds of different patterns can be formed by one multi-tone mask. Thus, the number of exposure masks and the number of corresponding photolithography processes can be reduced, so that the process can be simplified.

Further, an oxide conductive film functioning as a source and drain regions may be provided between the oxide semiconductor layer 716 and the conductive films 719 and 720 functioning as a source and drain electrodes. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, etching for forming the oxide conductive film and etching for forming the conductive films 719 and 720 may be performed concurrently.

With provision of the oxide conductive film functioning as a source and drain regions, resistance between the oxide semiconductor layer 716 and the conductive films 719 and 720 can be lowered, so that the transistor can operate at high speed. In addition, with provision of the oxide conductive film functioning as a source and drain regions, the withstand voltage of the transistor can be increased.

Next, plasma treatment may be performed using a gas such as $N_2O$, $N_2$, or Ar. With this plasma treatment, water and the like which attach to a surface of the oxide semiconductor layer exposed are removed. Alternatively, plasma treatment may be performed using a mixture gas of oxygen and argon.

Figure 8B:
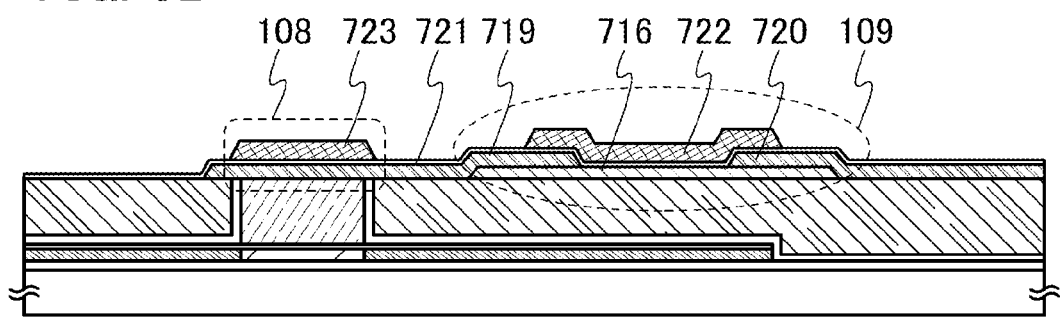

After the plasma treatment, as illustrated in FIG. 8B, the gate insulating film 721 is formed to cover the conductive films 719 and 720 and the oxide semiconductor layer 716. Then, a gate electrode 722 is formed over the gate insulating film 721 to overlap with the oxide semiconductor layer 716, and a conductive film 723 is formed over the conductive film 719 to overlap with the conductive film 719.

The gate insulating film 721 can be formed using a material and a layered structure which are similar to those of the gate insulating film 703. Note that the gate insulating film 721 preferably includes impurities such as moisture or hydrogen as little as possible, and the gate insulating film 721 may be formed using a single-layer insulating film or a plurality of insulating films stacked. When hydrogen is contained in the gate insulating film 721, hydrogen enters the oxide semiconductor layer 716 or oxygen in the oxide semiconductor layer 716 is extracted by hydrogen, whereby the oxide semiconductor layer 716 has lower resistance (n-type conductivity); thus, a parasitic channel might be formed. Thus, it is important that a deposition method in which hydrogen is not used be employed in order to form the gate insulating film 721 containing hydrogen as little as possible. A material having a high barrier property is preferably used for the gate insulating film 721. As the insulating film having a high barrier property, a silicon nitride film, a silicon nitride oxide film, an aluminum nitride film, an aluminum nitride oxide film, or the like can be used, for example. When a plurality of insulating films stacked are used, an insulating film having low proportion of nitrogen, such as a silicon oxide film or a silicon oxynitride film, is formed on a side which is closer to the oxide semiconductor layer 716 than the insulating film having a high barrier property. Then, the insulating film having a high barrier property is formed to overlap with the conductive films 719 and 720 and the oxide semiconductor layer 716 with the insulating film having low proportion of nitrogen sandwiched therebetween. When the insulating film having a high barrier property is used, impurities such as moisture or hydrogen can be prevented from entering the oxide semiconductor layer 716, the gate insulating film 721, or the interface between the oxide semiconductor layer 716 and another insulating film and the vicinity thereof. In addition, the insulating film having low proportion of nitrogen, such as a silicon oxide film or a silicon oxynitride film, is formed so as to be in contact with the oxide semiconductor layer 716, so that the insulating film having a high barrier property can be prevented from being in direct contact with the oxide semiconductor layer 716.

In this embodiment, the gate insulating film 721 with a structure in which a 100-nm-thick silicon nitride film formed by sputtering is stacked over a 200-nm-thick silicon oxide film formed by sputtering is formed. The substrate temperature during deposition is in the range of room temperature to 300° C., and is 100° C. in this embodiment.

After the gate insulating film 721 is formed, heat treatment may be performed. The heat treatment is performed in a nitrogen atmosphere, ultra-dry air, or a rare gas (e.g., argon or helium) atmosphere preferably at 200 to 400° C., for example, 250 to 350° C. It is preferable that the content of water in the gas be 20 ppm or lower, preferably 1 ppm or lower, more preferably 10 ppb or lower. In this embodiment, for example, heat treatment is performed at 250° C. for 1 hour in a nitrogen atmosphere. Alternatively, RTA treatment for a short time at a high temperature may be performed before the formation of the conductive films 719 and 720 in a manner similar to that of the heat treatment performed on the oxide semiconductor layer for reduction of moisture or hydrogen.

Even when oxygen defects are generated in the oxide semiconductor layer 716 by the heat treatment performed on the oxide semiconductor layer 716 by performing heat treatment after provision of the gate insulating film 721 containing oxygen, oxygen is supplied to the oxide semiconductor layer 716 from the gate insulating film 721. By the supply of oxygen to the oxide semiconductor layer 716, oxygen defects that serve as donors can be reduced in the oxide semiconductor layer 716 and the stoichiometric ratio can be satisfied. As a result, the oxide semiconductor layer 716 can be made substantially intrinsic and variation in electrical characteristics of the transistor due to oxygen defects can be reduced; thus, electrical characteristics can be improved. The timing of this heat treatment is not particularly limited as long as it is after the formation of the gate insulating film 721. When this heat treatment serves as heat treatment in another step (e.g., heat treatment during formation of a resin film or heat treatment for lowering the resistance of a transparent conductive film), the oxide semiconductor layer 716 can be made substantially intrinsic without the increase in the number of steps.

Alternatively, the oxygen defects that serve as donors in the oxide semiconductor layer 716 may be reduced by subjecting the oxide semiconductor layer 716 to heat treatment in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment in an oxygen atmosphere do not include water, hydrogen, or the like. Alternatively, the purity of the oxygen gas which is introduced into the heat treatment apparatus is preferably 6N (99.9999%) or higher, more preferably 7N (99.99999%) or higher (that is, the impurity concentration in oxygen is 1 ppm or lower, preferably 0.1 ppm or lower).

Alternatively, oxygen may be added to the oxide semiconductor layer 716 by ion implantation, ion doping, or the like so that oxygen defects that serve as donors are reduced. For example, oxygen made to be plasma with a microwave of 2.45 GHz may be added to the oxide semiconductor layer 716.

The gate electrode 722 and the conductive film 723 can be formed in such a manner that a conductive film is formed over the gate insulating film 721 and then is etched. The gate electrode 722 and the conductive film 723 can be formed using a material and a layered structure which are similar to those of the gate electrode 707 and the conductive films 719 and 720.

The thickness of each of the gate electrode 722 and the conductive film 723 is 10 to 400 nm, preferably 100 to 200 nm. In this embodiment, after a 150-nm-thick conductive film for the gate electrode is formed by sputtering using a tungsten target, the conductive film is etched to have a desired shape, so that the gate electrode 722 and the conductive film 723 are formed. A resist mask may be formed by an inkjet method. When the resist mask is formed by an inkjet method, a photomask is not used; thus, manufacturing cost can be reduced.

Through the above steps, the transistor 109 is formed.

Note that a portion where the conductive film 719 and the conductive film 723 overlap with each other with the gate insulating film 721 provided therebetween corresponds to the capacitor 108.

Although the transistor 109 is described as a single-gate transistor, a multi-gate transistor including a plurality of channel formation regions can be formed when the plurality of gate electrodes 714 which are electrically connected are included when needed.

Note that an insulating film which is in contact with the oxide semiconductor layer 716 (in this embodiment, corresponding to the gate insulating film 721) may be formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating film which is in contact with the oxide semiconductor layer, the state of an interface with the oxide semiconductor layer can be kept well.

An insulating material containing an element that belongs to Group 13 is an insulating material containing one or more elements that belong to Group 13. Examples of the insulating material containing an element that belongs to Group 13 include gallium oxide, aluminum oxide, aluminum gallium oxide, and gallium aluminum oxide. Here, aluminum gallium oxide is a material whose content of aluminum is larger than the content of gallium in an atomic percent, and gallium aluminum oxide is a material whose content of gallium is larger than or equal to the content of aluminum in an atomic percent.

For example, in the case where an insulating film is formed in contact with an oxide semiconductor layer containing gallium, when a material containing gallium oxide is used for the insulating film, favorable characteristics can be kept at the interface between the oxide semiconductor layer and the insulating film. For example, when the oxide semiconductor layer and the insulating film containing gallium oxide are provided in contact with each other, pileup of hydrogen at the interface between the oxide semiconductor layer and the insulating film can be reduced. Note that a similar effect can be obtained in the case where an element that belongs to the same group as a constituent element of the oxide semiconductor is used for the insulating film. For example, it is effective to form an insulating film with the use of a material containing aluminum oxide. Aluminum oxide does not easily transmit water. Thus, it is preferable to use the material including aluminum oxide in order to prevent water from entering the oxide semiconductor layer.

The insulating film which is in contact with the oxide semiconductor layer 716 preferably contains oxygen in a proportion higher than that in the stoichiometric composition, by heat treatment in an oxygen atmosphere or oxygen doping. Oxygen doping is addition of oxygen to a bulk. Note that the term "bulk" is used in order to clarify that oxygen is added not only to a surface of a thin film but also to the inside of the thin film. In addition, the term "oxygen doping" includes "oxygen plasma doping" in which oxygen which is made to be plasma is added to a bulk. The oxygen doping may be performed by ion implantation or ion doping.

For example, in the case where the insulating film which is in contact with the oxide semiconductor layer 716 is formed using gallium oxide, the composition of gallium oxide can be set to be $Ga_2O_X$ (X=3+a, 0<a<1) by heat treatment in an oxygen atmosphere or oxygen doping.

In the case where the insulating film which is in contact with the oxide semiconductor layer 716 is formed using aluminum oxide, the composition of aluminum oxide can be set to be $Al_2O_X$ (X=3+a, 0<a<1) by heat treatment in an oxygen atmosphere or oxygen doping.

In the case where the insulating film which is in contact with the oxide semiconductor layer 716 is formed using gallium aluminum oxide (aluminum gallium oxide), the composition of gallium aluminum oxide (aluminum gallium oxide) can be set to be $Ga_XAl_{2-X}O_{3+a}$, (0<X<2, 0<a<1) by heat treatment in an oxygen atmosphere or oxygen doping.

By oxygen doping, an insulating film including a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen deficiency in the oxide semiconductor layer or at the interface between the oxide semiconductor layer and the insulating film is reduced. Thus, the oxide semiconductor layer can be an intrinsic or substantially intrinsic oxide semiconductor.

The insulating film including a region where the proportion of oxygen is higher than that in the stoichiometric composition may be applied to either the insulating film placed on an upper side of the oxide semiconductor layer or the insulating film placed on a lower side of the oxide semiconductor layer of the insulating films which are in contact with the oxide semiconductor layer 716; however, it is preferable to apply such an insulating film to both the insulating films which are in contact with the oxide semiconductor layer 716. The above effect can be enhanced with a structure where the oxide semiconductor layer 716 is sandwiched between the insulating films each including a region where the proportion of oxygen is higher than that in the stoichiometric composition, which are used as the insulating films in contact with the oxide semiconductor layer 716 and positioned on the upper side and the lower side of the oxide semiconductor layer 716.

The insulating films on the upper side and the lower side of the oxide semiconductor layer 716 may contain the same constituent element or different constituent elements. For example, the insulating films on the upper side and the lower side may be both formed using gallium oxide whose composition is $Ga_2O_X$ (X=3+a, 0<a<1). Alternatively, one of the insulating films on the upper side and the lower side may be formed using $Ga_2O_X$ (X=3+a, 0<a<1) and the other may be formed using aluminum oxide whose composition is $Al_2O_X$ (X=3+a, 0<a<1).

The insulating film which is in contact with the oxide semiconductor layer 716 may be formed by a stack of insulating films each including a region where the proportion of oxygen is higher than that in the stoichiometric composition. For example, the insulating film on the upper side of the oxide semiconductor layer 716 may be formed as follows: gallium oxide whose composition is $Ga_2O_X$ (X=3+a, 0<a<1) is formed and gallium aluminum oxide (aluminum gallium oxide) whose composition is $Ga_XAl_{2-X}O_{3+a}$, (0<X<2, 0<a<1) may be formed thereover. Note that the insulating film on the lower side of the oxide semiconductor layer 716 may be formed by a stack of insulating films each including a region where the proportion of oxygen is higher than that in the stoichiometric composition. Alternatively, both the insulating films on the upper side and the lower side of the oxide semiconductor layer 716 may be formed by a stack of insulating films each including a region where the proportion of oxygen is higher than that in the stoichiometric composition.

Figure 8C:
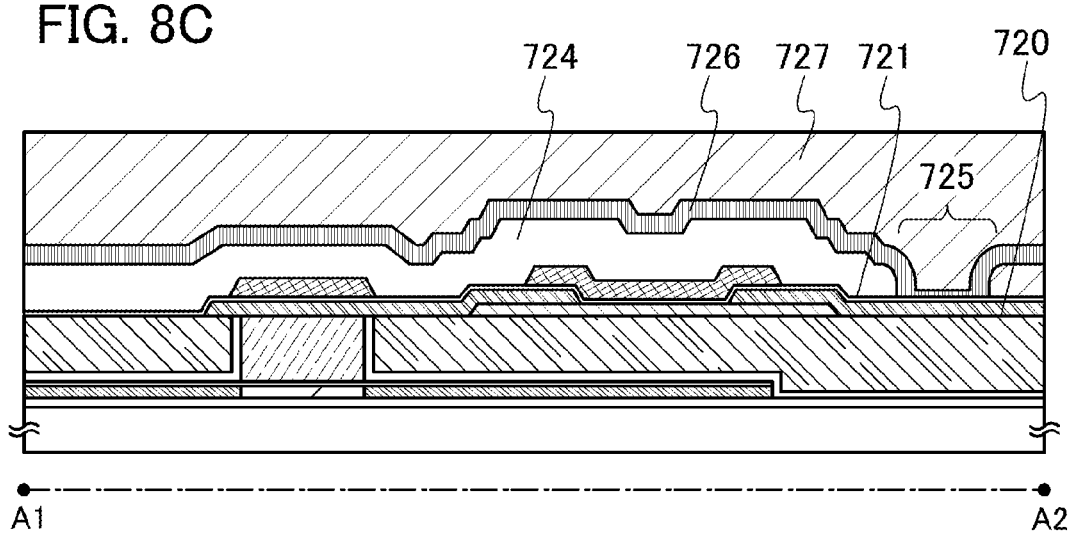

Next, as illustrated in FIG. 8C, an insulating film 724 is formed so as to cover the gate insulating film 721, the conductive film 723, and the gate electrode 722. The insulating film 724 can be formed by PVD, CVD, or the like. The insulating film 724 can be formed using a material including an inorganic insulating material such as silicon oxide, silicon oxynitride, silicon nitride, hafnium oxide, gallium oxide, or aluminum oxide. Note that for the insulating film 724, a material with a low dielectric constant or a structure with a low dielectric constant (e.g., a porous structure) is preferably used. When the dielectric constant of the insulating film 724 is lowered, parasitic capacitance generated between wirings or electrodes can be reduced, which results in higher speed operation. Note that although the insulating film 724 has a single-layer structure in this embodiment, one embodiment of the present invention is not limited to this structure. The insulating film 724 may have a layered structure of two or more layers.

Next, an opening 725 is formed in the gate insulating film 721 and the insulating film 724, so that part of the conductive film 720 is exposed. After that, a wiring 726 which is in contact with the conductive film 720 through the opening 725 is formed over the insulating film 724.

A conductive film is formed by PVD or CVD and then is etched, so that the wiring 726 is formed. As the material of the conductive film, an element selected from aluminum, chromium, copper, tantalum, titanium, molybdenum, or tungsten; an alloy containing any of these elements as a component; or the like can be used. A material including one of manganese, magnesium, zirconium, beryllium, neodymium, and scandium or a combination of any of these elements may be used.

Specifically, for example, it is possible to employ a method in which a thin titanium film is formed in a region including the opening of the insulating film 724 by PVD and a thin titanium film (with a thickness of approximately 5 nm) is formed by PVD, and then an aluminum film is formed so as to be embedded in the opening 725. Here, the titanium film formed by PVD has a function of reducing an oxide film (e.g., a native oxide film) formed on a surface over which the titanium film is formed, to decrease the contact resistance with the lower electrode or the like (here, the conductive film 720). In addition, hillocks of the aluminum film can be prevented. A copper film may be formed by a plating method after a barrier film of titanium, titanium nitride, or the like is formed.

Next, an insulating film 727 is formed to cover the wiring 726. Through the series of steps, the storage element can be formed.

Note that in the formation method, the conductive films 719 and 720 functioning as a source and drain electrodes are formed after the formation of the oxide semiconductor layer 716. Thus, as illustrated in FIG. 8B, in the transistor 109 obtained by the manufacturing method, the conductive films 719 and 720 are formed over the oxide semiconductor layer 716. However, in the transistor 109, the conductive films functioning as a source and drain electrodes may be formed below the oxide semiconductor layer 716, that is, between the oxide semiconductor layer 716 and the insulating films 712 and 713.

Figure 9:
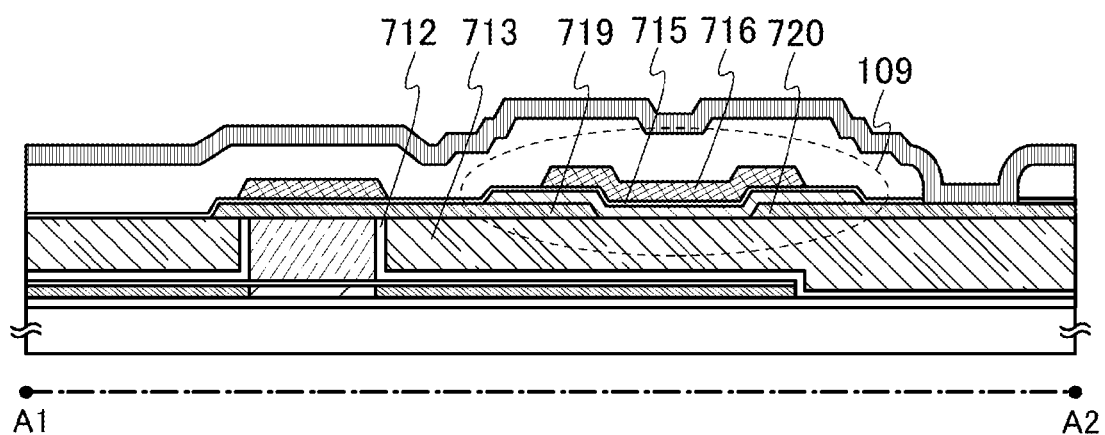
FIG. 9 is a cross-sectional view illustrating the structure of the storage element.

FIG. 9 is a cross-sectional view of the transistor 109 at the time when the conductive films 719 and 720 functioning as a source and drain electrodes are provided between the oxide semiconductor layer 716 and the insulating films 712 and 713. The transistor 109 illustrated in FIG. 9 can be obtained in such a manner that the conductive films 719 and 720 are formed after the formation of the insulating film 713, and then the oxide semiconductor layer 716 is formed.

This embodiment can be combined with any of the above embodiments as appropriate.

(Embodiment 7)

In this embodiment, a transistor including an oxide semiconductor layer with a structure different from the structure in Embodiment 6 is described.

Figure 10A:
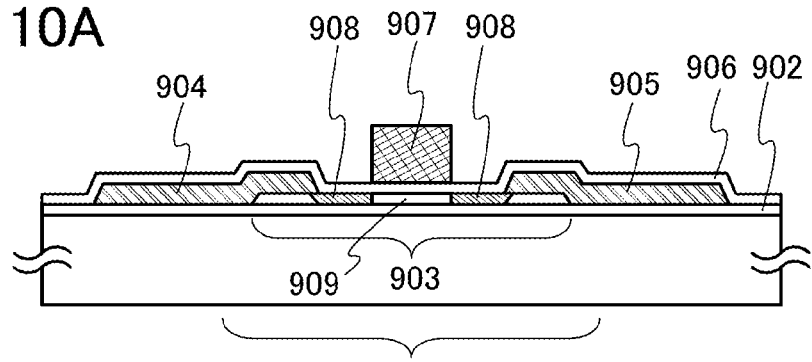
FIGS. 10A to 10D are cross-sectional views each illustrating the structure of a transistor which has a channel in an oxide semiconductor layer.

A transistor 901 illustrated in FIG. 10A includes an oxide semiconductor layer 903 that is formed over an insulating film 902 and functions as an active layer; a source electrode 904 and a drain electrode 905 that are formed over the oxide semiconductor layer 903; a gate insulating film 906 that is formed over the oxide semiconductor layer 903, the source electrode 904, and the drain electrode 905; and a gate electrode 907 that overlaps with the oxide semiconductor layer 903 over the gate insulating film 906.

The transistor 901 illustrated in FIG. 10A is a top-gate transistor in which the gate electrode 907 is formed over the oxide semiconductor layer 903 and is also a top-contact transistor in which the source electrode 904 and the drain electrode 905 are formed over the oxide semiconductor layer 903. In the transistor 901, the source electrode 904 and the drain electrode 905 do not overlap with the gate electrode 907. In other words, a gap which is larger than the thickness of the gate insulating film 906 is provided between the source electrode 904 and the gate electrode 907 and between the drain electrode 905 and the gate electrode 907. Thus, in the transistor 901, parasitic capacitance formed between the source electrode 904 and the gate electrode 907 and between the drain electrode 905 and the gate electrode 907 can be reduced. Consequently, high-speed operation can be performed.

The oxide semiconductor layer 903 includes a pair of high-concentration regions 908 that can be obtained by addition of a dopant imparting n-type conductivity to the oxide semiconductor layer 903 after the formation of the gate electrode 907. In addition, in the oxide semiconductor layer 903, a region which overlaps with the gate electrode 907 with the gate insulating film 906 provided therebetween is a channel formation region 909. The oxide semiconductor layer 903 includes the channel formation region 909 between the pair of high-concentration regions 908. Addition of a dopant for formation of the pair of high-concentration regions 908 can be performed by ion implantation. A rare gas such as helium, argon, or xenon; a Group 15 atom such as nitrogen, phosphorus, arsenic, or antimony; or the like can be used as the dopant, for example.

For example, in the case where nitrogen is used as the dopant, the concentration of nitrogen atoms in the high-concentration region 908 is preferably $5 \times 10^{19}/cm^3$ or higher and $1 \times 10^{22}/cm^3$ or lower.

The high-concentration region 908 to which the dopant imparting n-type conductivity is added has higher conductivity than other regions in the oxide semiconductor layer 903. Thus, with provision of the high-concentration regions 908 in the oxide semiconductor layer 903, resistance between the source electrode 904 and the drain electrode 905 can be lowered.

In the case where an In—Ga—Zn-based oxide semiconductor is used for the oxide semiconductor layer 903, an oxide semiconductor in the high-concentration regions 908 has a wurtzite crystal structure by heat treatment at 300 to 600° C. for 1 hour after the addition of nitrogen. When the oxide semiconductor in the high-concentration regions 908 has a wurtzite crystal structure, the conductivity of the high-concentration regions 908 can be further increased and the resistance between the source electrode 904 and the drain electrode 905 can be further lowered. Note that in order to effectively lower the resistance between the source electrode 904 and the drain electrode 905 by formation of an oxide semiconductor with a wurtzite crystal structure, the concentration of nitrogen atoms in the high-concentration region 908 is preferably $1 \times 10^{20}/cm^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

Alternatively, the oxide semiconductor layer 903 may be formed using an oxide including a CAAC. In the case where the oxide semiconductor layer 903 is formed using an oxide including a CAAC, the conductivity of the oxide semiconductor layer 903 can be increased as compared to the case where an amorphous crystal is used. Thus, the resistance between the source electrode 904 and the drain electrode 905 can be lowered.

When the resistance between the source electrode 904 and the drain electrode 905 is lowered, high on-state current and high-speed operation can be secured even when the transistor 901 is miniaturized. In addition, by miniaturization of the transistor 901, the area of a storage element including the transistor can be reduced, so that memory capacity per unit area can be increased.

Figure 10B:
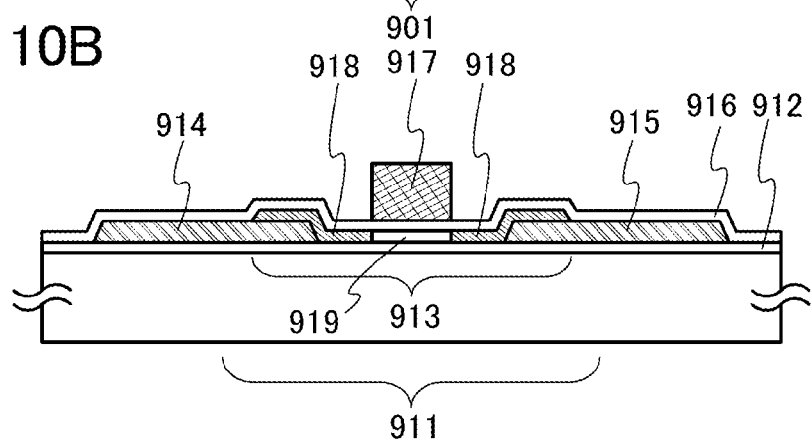

A transistor 911 illustrated in FIG. 10B includes a source electrode 914 and a drain electrode 915 that are formed over an insulating film 912; an oxide semiconductor layer 913 that is formed over the source electrode 914 and the drain electrode 915 and functions as an active layer; a gate insulating film 916 that is formed over the oxide semiconductor layer 913, the source electrode 914, and the drain electrode 915; and a gate electrode 917 that overlaps with the oxide semiconductor layer 913 over the gate insulating film 916.

The transistor 911 illustrated in FIG. 10B is a top-gate transistor in which the gate electrode 917 is formed over the oxide semiconductor layer 913 and is also a bottom-contact transistor in which the source electrode 914 and the drain electrode 915 are formed below the oxide semiconductor layer 913. As in the transistor 901, in the transistor 911, the source electrode 914 and the drain electrode 915 do not overlap with the gate electrode 917. Thus, parasitic capacitance formed between the source electrode 914 and the gate electrode 917 and between the drain electrode 915 and the gate electrode 917 can be reduced. Consequently, high-speed operation can be performed.

The oxide semiconductor layer 913 includes a pair of high-concentration regions 918 that can be obtained by addition of a dopant imparting n-type conductivity to the oxide semiconductor layer 913 after the formation of the gate electrode 917. In addition, in the oxide semiconductor layer 913, a region which overlaps with the gate electrode 917 with the gate insulating film 916 provided therebetween is a channel formation region 919. The oxide semiconductor layer 913 includes the channel formation region 919 between the pair of high-concentration regions 918.

The pair of high-concentration regions 918 can be formed by ion implantation as in the high-concentration regions 908 of the transistor 901. The high-concentration regions 908 can be referred to for the kind of a dopant used for the formation of the high-concentration regions 918.

For example, in the case where nitrogen is used as the dopant, the concentration of nitrogen atoms in the high-concentration region 918 is preferably $5 \times 10^{19}/cm^3$ or higher and $1 \times 10^{22}/cm^3$ or lower.

The high-concentration region 918 to which the dopant imparting n-type conductivity is added has higher conductivity than other regions in the oxide semiconductor layer 913. Thus, with provision of the high-concentration regions 918 in the oxide semiconductor layer 913, resistance between the source electrode 914 and the drain electrode 915 can be lowered.

In the case where an In—Ga—Zn-based oxide semiconductor is used for the oxide semiconductor layer 913, an oxide semiconductor in the high-concentration regions 918 has a wurtzite crystal structure by heat treatment at approximately 300 to 600° C. after the addition of nitrogen. When the oxide semiconductor in the high-concentration regions 918 has a wurtzite crystal structure, the conductivity of the high-concentration regions 918 can be further increased and the resistance between the source electrode 914 and the drain electrode 915 can be further lowered. Note that in order to effectively lower the resistance between the source electrode 914 and the drain electrode 915 by formation of an oxide semiconductor with a wurtzite crystal structure, the concentration of nitrogen atoms in the high-concentration region 918 is preferably $1 \times 10^{20}/cm^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

Alternatively, the oxide semiconductor layer 913 may be formed using an oxide including a CAAC. In the case where the oxide semiconductor layer 913 is formed using an oxide including a CAAC, the conductivity of the oxide semiconductor layer 913 can be increased as compared to the case where an amorphous crystal is used. Thus, the resistance between the source electrode 914 and the drain electrode 915 can be lowered.

When the resistance between the source electrode 914 and the drain electrode 915 is lowered, high on-state current and high-speed operation can be secured even when the transistor 911 is miniaturized. In addition, by miniaturization of the transistor 911, the area of a storage element including the transistor can be reduced, so that memory capacity per unit area can be increased.

Figure 10C:
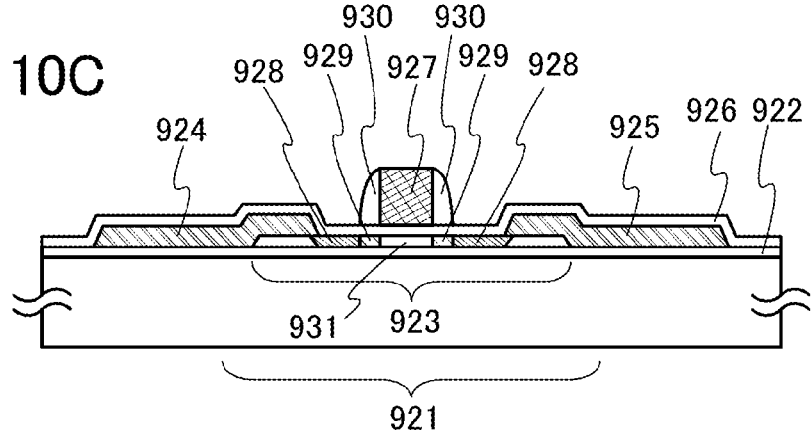

A transistor 921 illustrated in FIG. 10C includes an oxide semiconductor layer 923 that is formed over an insulating film 922 and functions as an active layer; a source electrode 924 and a drain electrode 925 that are formed over the oxide semiconductor layer 923; a gate insulating film 926 that is formed over the oxide semiconductor layer 923, the source electrode 924, and the drain electrode 925; and a gate electrode 927 that overlaps with the oxide semiconductor layer 923 over the gate insulating film 926. The transistor 921 further includes sidewalls 930 that are provided at ends of the gate electrode 927 and are formed using an insulating film.

The transistor 921 illustrated in FIG. 10C is a top-gate transistor in which the gate electrode 927 is formed over the oxide semiconductor layer 923 and is also a top-contact transistor in which the source electrode 924 and the drain electrode 925 are formed over the oxide semiconductor layer 923. As in the transistor 901, in the transistor 921, the source electrode 924 and the drain electrode 925 do not overlap with the gate electrode 927. Thus, parasitic capacitance formed between the source electrode 924 and the gate electrode 927 and between the drain electrode 925 and the gate electrode 927 can be reduced. Consequently, high-speed operation can be performed.

The oxide semiconductor layer 923 includes a pair of high-concentration regions 928 and a pair of low-concentration regions 929 that can be obtained by addition of a dopant imparting n-type conductivity to the oxide semiconductor layer 923 after the formation of the gate electrode 927. In addition, in the oxide semiconductor layer 923, a region which overlaps with the gate electrode 927 with the gate insulating film 926 provided therebetween is a channel formation region 931. The oxide semiconductor layer 923 includes the pair of low-concentration regions 929 between the pair of high-concentration regions 928 and the channel formation region 931 between the pair of low-concentration regions 929. Further, the pair of low-concentration regions 929 is provided in a region of the oxide semiconductor layer 923 that overlaps with the sidewalls 930 with the gate insulating film 926 provided therebetween.

The pair of high-concentration regions 928 and the pair of low-concentration regions 929 can be formed by ion implantation as in the high-concentration regions 908 of the transistor 901. The high-concentration regions 908 can be referred to for the kind of a dopant used for the formation of the high-concentration regions 928.

For example, in the case where nitrogen is used as the dopant, the concentration of nitrogen atoms in the high-concentration region 928 is preferably $5 \times 10^{19}/cm^3$ or higher and $1 \times 10^{22}/cm^3$ or lower. Further, for example, in the case where nitrogen is used as the dopant, the concentration of nitrogen atoms in the low-concentration region 929 is preferably $5 \times 10^{18}/cm^3$ or higher and lower than $5 \times 10^{19}/cm^3$.

The high-concentration region 928 to which the dopant imparting n-type conductivity is added has higher conductivity than other regions in the oxide semiconductor layer 923. Thus, with provision of the high-concentration regions 928 in the oxide semiconductor layer 923, resistance between the source electrode 924 and the drain electrode 925 can be lowered. Further, with provision of the low-concentration region 929 between the channel formation region 931 and the high-concentration region 928, a negative shift in threshold voltage due to a short channel effect can be reduced.

In the case where an In—Ga—Zn-based oxide semiconductor is used for the oxide semiconductor layer 923, an oxide semiconductor in the high-concentration regions 928 has a wurtzite crystal structure by heat treatment at approximately 300 to 600° C. after the addition of nitrogen. Further, depending on the concentration of nitrogen, the low-concentration region 929 has a wurtzite crystal structure in some cases. When the oxide semiconductor in the high-concentration regions 928 has a wurtzite crystal structure, the conductivity of the high-concentration regions 928 can be further increased and the resistance between the source electrode 924 and the drain electrode 925 can be further lowered. Note that in order to effectively lower the resistance between the source electrode 924 and the drain electrode 925 by formation of an oxide semiconductor with a wurtzite crystal structure, the concentration of nitrogen atoms in the high-concentration region 928 is preferably $1 \times 10^{20}/cm^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

Alternatively, the oxide semiconductor layer 923 may be formed using an oxide including a CAAC. In the case where the oxide semiconductor layer 923 is formed using an oxide including a CAAC, the conductivity of the oxide semiconductor layer 923 can be increased as compared to the case where an amorphous crystal is used. Thus, the resistance between the source electrode 924 and the drain electrode 925 can be lowered.

When the resistance between the source electrode 924 and the drain electrode 925 is lowered, high on-state current and high-speed operation can be secured even when the transistor 921 is miniaturized. In addition, by miniaturization of the transistor 921, the area of a memory cell including the transistor can be reduced, so that memory capacity per unit area can be increased.

Figure 10D:
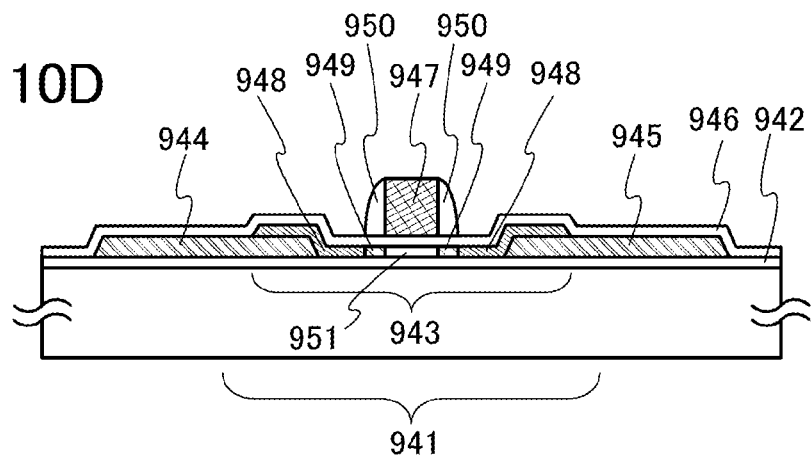

A transistor 941 illustrated in FIG. 10D includes a source electrode 944 and a drain electrode 945 that are formed over an insulating film 942; an oxide semiconductor layer 943 that is formed over the source electrode 944 and the drain electrode 945 and functions as an active layer; a gate insulating film 946 that is formed over the oxide semiconductor layer 943, the source electrode 944, and the drain electrode 945; and a gate electrode 947 that overlaps with the oxide semiconductor layer 943 over the gate insulating film 946. The transistor 941 further includes sidewalls 950 that are provided at ends of the gate electrode 947 and are formed using an insulating film.

The transistor 941 illustrated in FIG. 10D is a top-gate transistor in which the gate electrode 947 is formed over the oxide semiconductor layer 943 and is also a bottom-contact transistor in which the source electrode 944 and the drain electrode 945 are formed below the oxide semiconductor layer 943. As in the transistor 901, in the transistor 941, the source electrode 944 and the drain electrode 945 do not overlap with the gate electrode 947. Thus, parasitic capacitance formed between the source electrode 944 and the gate electrode 947 and between the drain electrode 945 and the gate electrode 947 can be reduced. Consequently, high-speed operation can be performed.

The oxide semiconductor layer 943 includes a pair of high-concentration regions 948 and a pair of low-concentration regions 949 that can be obtained by addition of a dopant imparting n-type conductivity to the oxide semiconductor layer 943 after the formation of the gate electrode 947. In addition, in the oxide semiconductor layer 943, a region which overlaps with the gate electrode 947 with the gate insulating film 946 provided therebetween is a channel formation region 951. The oxide semiconductor layer 943 includes the pair of low-concentration regions 949 between the pair of high-concentration regions 948 and the channel formation region 951 between the pair of low-concentration regions 949. Further, the pair of low-concentration regions 949 is provided in a region of the oxide semiconductor layer 943 that overlaps with the sidewalls 950 with the gate insulating film 946 provided therebetween.

The pair of high-concentration regions 948 and the pair of low-concentration regions 949 can be formed by ion implantation as in the high-concentration regions 908 of the transistor 901. The high-concentration regions 908 can be referred to for the kind of a dopant used for the formation of the high-concentration regions 948.

For example, in the case where nitrogen is used as the dopant, the concentration of nitrogen atoms in the high-concentration region 948 is preferably $5 \times 10^{19}/cm^3$ or higher and $1 \times 10^{22}/cm^3$ or lower. Further, for example, in the case where nitrogen is used as the dopant, the concentration of nitrogen atoms in the low-concentration region 949 is preferably $5 \times 10^{18}/cm^3$ or higher and lower than $5 \times 10^{19}/cm^3$.

The high-concentration region 948 to which the dopant imparting n-type conductivity is added has higher conductivity than other regions in the oxide semiconductor layer 943. Thus, with provision of the high-concentration regions 948 in the oxide semiconductor layer 943, resistance between the source electrode 944 and the drain electrode 945 can be lowered. Further, with provision of the low-concentration region 949 between the channel formation region 951 and the high-concentration region 948, a negative shift in threshold voltage due to a short channel effect can be reduced.

In the case where an In—Ga—Zn-based oxide semiconductor is used for the oxide semiconductor layer 943, an oxide semiconductor in the high-concentration regions 948 has a wurtzite crystal structure by heat treatment at approximately 300 to 600° C. after the addition of nitrogen. Further, depending on the concentration of nitrogen, the low-concentration region 949 has a wurtzite crystal structure in some cases. When the oxide semiconductor in the high-concentration regions 948 has a wurtzite crystal structure, the conductivity of the high-concentration regions 948 can be further increased and the resistance between the source electrode 944 and the drain electrode 945 can be further lowered. Note that in order to effectively lower the resistance between the source electrode 944 and the drain electrode 945 by formation of an oxide semiconductor with a wurtzite crystal structure, the concentration of nitrogen atoms in the high-concentration region 948 is preferably $1\times10^{20}/cm^3$ or higher and 7 at. % or lower in the case where nitrogen is used as the dopant. Even in the case where the concentration of nitrogen atoms is lower than the above range, an oxide semiconductor with a wurtzite crystal structure can be obtained in some cases.

Alternatively, the oxide semiconductor layer 943 may be formed using an oxide including a CAAC. In the case where the oxide semiconductor layer 943 is formed using an oxide including a CAAC, the conductivity of the oxide semiconductor layer 943 can be increased as compared to the case where an amorphous crystal is used. Thus, the resistance between the source electrode 944 and the drain electrode 945 can be lowered.

When the resistance between the source electrode 944 and the drain electrode 945 is lowered, high on-state current and high-speed operation can be secured even when the transistor 941 is miniaturized. In addition, by miniaturization of the transistor 941, the area of a storage element including the transistor can be reduced, so that memory capacity per unit area can be increased.

Note that as one of methods for forming a high-concentration region functioning as a source region or a drain region in a transistor including an oxide semiconductor through a self-aligning process, a method has been disclosed by which a surface of an oxide semiconductor layer is exposed, argon plasma treatment is performed, and the resistance of a region in the oxide semiconductor layer that is exposed to plasma is lowered (S. Jeon et al., "180 nm Gate Length Amorphous InGaZnO Thin Film Transistor for High Density Image Sensor Application", IEDM Tech. Dig., p. 504, 2010).

However, in the formation method, it is necessary to remove a gate insulating film partly so that a region serving as a source region or a drain region is exposed after the formation of the gate insulating film. Thus, when the gate insulating film is removed, the oxide semiconductor layer that is the lower layer is over etched partly, so that the thickness of the region serving as the source region or the drain region is decreased. Consequently, the resistance of the source region or the drain region is increased and defects in characteristics of the transistor due to over etching easily occur.

In order to miniaturize the transistor, it is necessary to employ dry etching, which has high processing accuracy. The over etching particularly occurs easily in the case where dry etching, which cannot secure selective etching of the gate insulating film with respect to the oxide semiconductor layer sufficiently.

For example, over etching does not matter when the oxide semiconductor layer has sufficient large thickness. However, in the case where the channel length is 200 nm or less, it is necessary that the thickness of a region in the oxide semiconductor layer that serves as a channel formation region be 20 nm or less, preferably 10 nm or less in order to prevent a short channel effect. In the case where such a thin oxide semiconductor layer is used, the over etching of the oxide semiconductor layer is unfavorable because the resistance of the source region or the drain region is increased and defects in characteristics of the transistor occur as described above.

However, when a dopant is added to the oxide semiconductor layer while the oxide semiconductor layer is not exposed and the gate insulating film is left as in one embodiment of the present invention, the over etching of the oxide semiconductor layer can be prevented and excessive damage to the oxide semiconductor layer can be reduced. Further, an interface between the oxide semiconductor layer and the gate insulating film is kept clean. Thus, the characteristics and reliability of the transistor can be improved.

This embodiment can be combined with any of the above embodiments as appropriate.

(Embodiment 8)

In this embodiment, one aspect of the structure of a storage device is described.

Figure 11:
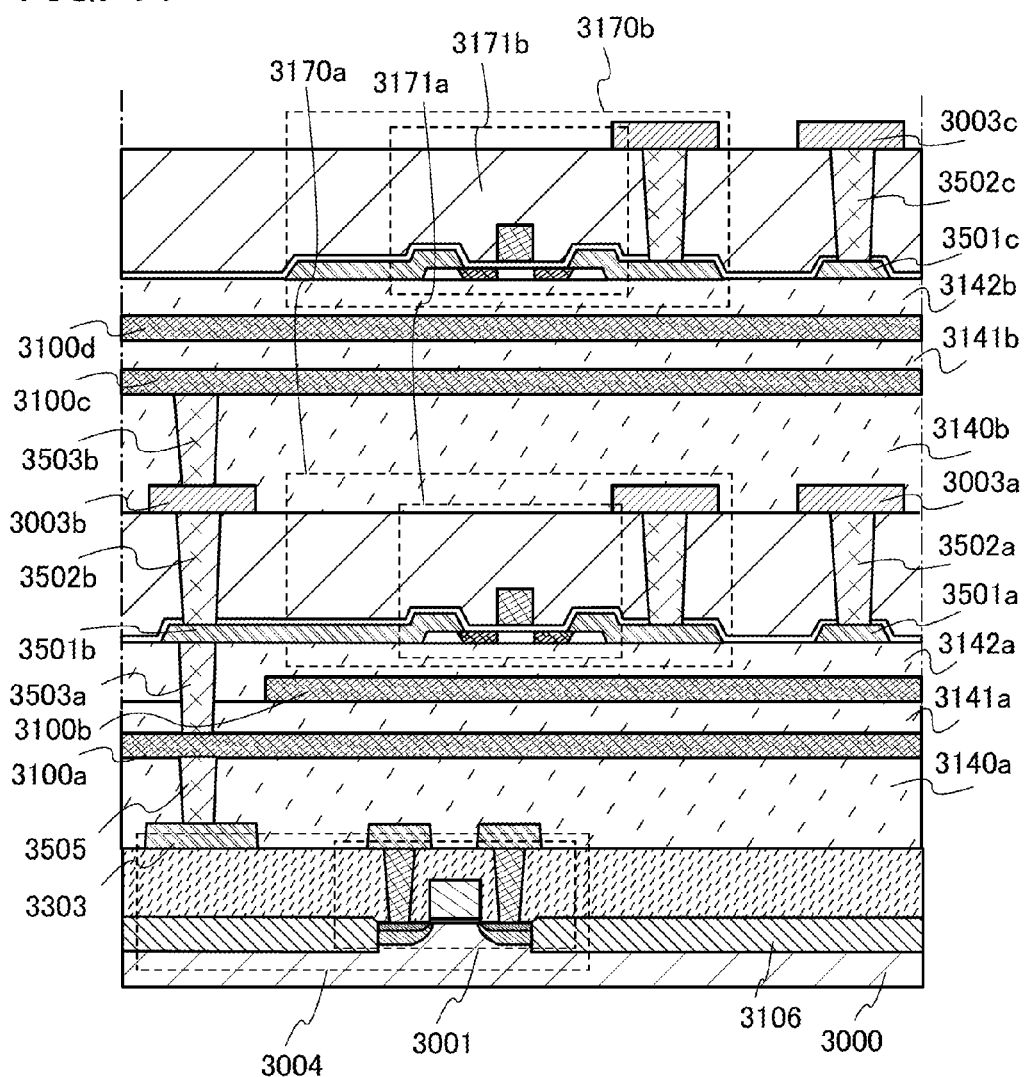
FIG. 11 is a cross-sectional view illustrating the structure of a storage device.
Figure 12:
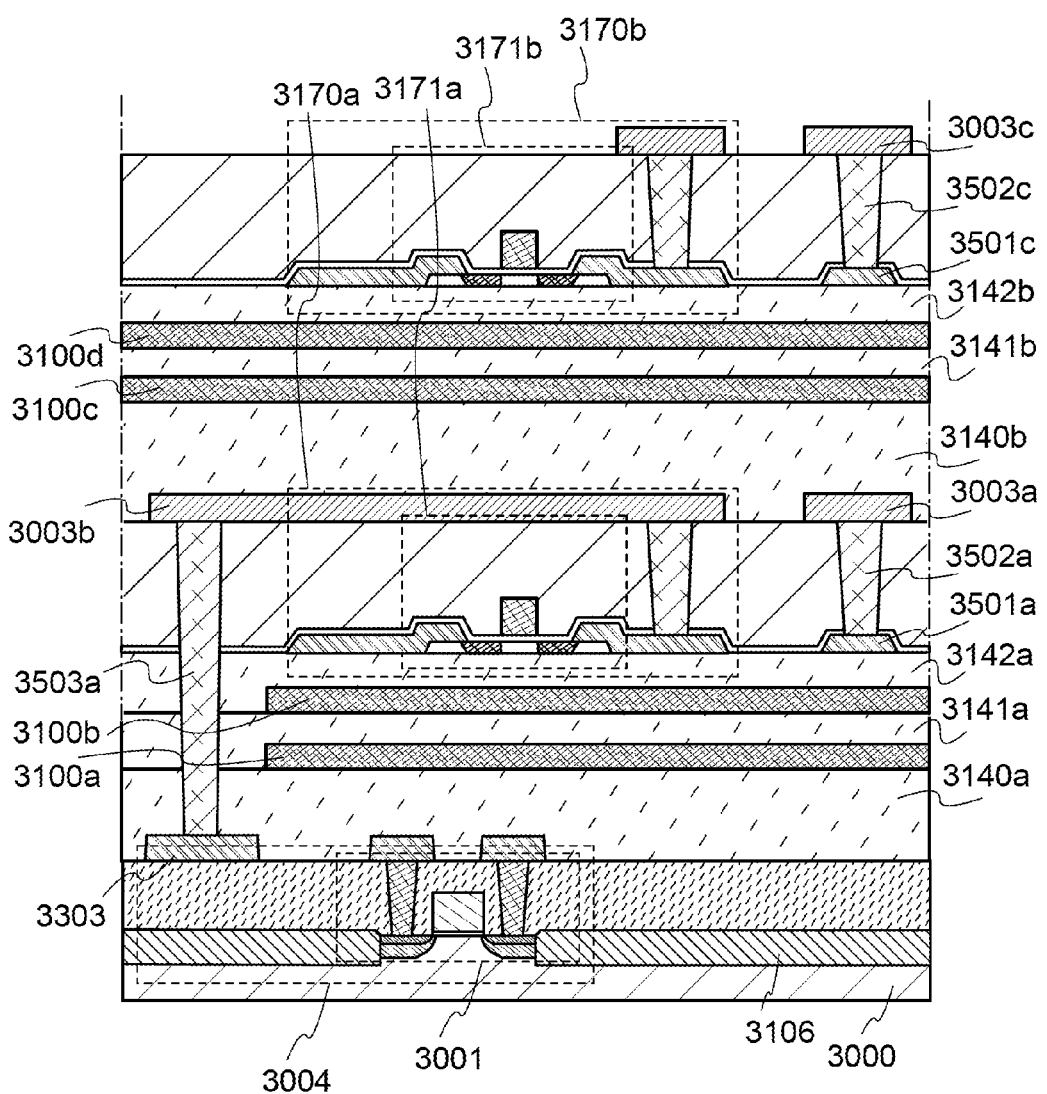
FIG. 12 is a cross-sectional view illustrating the structure of a storage device.

FIG. 11 and FIG. 12 are cross-sectional views of storage devices. Each of the storage devices illustrated in FIG. 11 and FIG. 12 includes a plurality of storage elements formed in multiple layers in an upper portion and a logic circuit 3004 in a lower portion. A storage element 3170a and a storage element 3170b are illustrated as typical examples of the plurality of storage elements. The storage element 3170a and the storage element 3170b can each have a structure that is similar to the structure of the storage element 100 described in the above embodiment, for example.

Note that a transistor 3171a included in the storage element 3170a is illustrated as a typical example. A transistor 3171b included in the storage element 3170b is illustrated as a typical example. The transistor 3171a and the transistor 3171b each include a channel formation region in an oxide semiconductor layer. Description of the structure of the transistor including a channel formation region in an oxide semiconductor layer is omitted because the structure is similar to the structure described in any of the other embodiments.

An electrode 3501a that is formed in the same layer as a source electrode and a drain electrode of the transistor 3171a is electrically connected to an electrode 3003a through an electrode 3502a. An electrode 3501c that is formed in the same layer as a source electrode and a drain electrode of the transistor 3171b is electrically connected to an electrode 3003c through an electrode 3502c.

A logic circuit 3004 includes a transistor 3001 including a semiconductor material other than an oxide semiconductor in a channel formation region. The transistor 3001 can be formed by provision of an element isolation insulating film 3106 in a substrate 3000 including a semiconductor material (e.g., silicon) and by formation of a region serving as the channel formation region in a region surrounded by the element isolation insulating film 3106. Note that the transistor 3001 may be a transistor which has a channel formation region in a semiconductor film such as a silicon film formed over an insulating surface or a silicon film of an SOI substrate. The description of the structure of the transistor 3001 is omitted because a known structure can be used.

A wiring 3100a and a wiring 3100b are formed between a layer in which the transistor 3171a is formed and a layer in which the transistor 3001 is formed. An insulating film 3140a is provided between the wiring 3100a and the layer in which the transistor 3001 is formed. An insulating film 3141a is provided between the wiring 3100a and the wiring 3100b. An insulating film 3142a is provided between the wiring 3100b and the layer in which the transistor 3171a is formed.

Similarly, a wiring 3100c and a wiring 3100d are formed between a layer in which the transistor 3171b is formed and the layer in which the transistor 3171a is formed. An insulating film 3140b is provided between the wiring 3100c and the layer in which the transistor 3171a is formed. An insulating film 3141b is provided between the wiring 3100c and the wiring 3100d. An insulating film 3142b is provided between the wiring 3100d and the layer in which the transistor 3171b is formed.

The insulating film 3140a, the insulating film 3141a, the insulating film 3142a, the insulating film 3140b, the insulating film 3141*b*, and the insulating film 3142*b* function as interlayer insulating films, and surfaces of these insulating films can be flattened.

Through the wiring 3100*a*, the wiring 3100*b*, the wiring 3100*c*, and the wiring 3100*d*, electrical connection between the storage elements, electrical connection between the logic circuit 3004 and the storage element, or the like can be performed.

An electrode 3303 included in the logic circuit 3004 can be electrically connected to a circuit provided in the upper portion.

For example, as illustrated in FIG. 11, the electrode 3303 can be electrically connected to the wiring 3100*a* through an electrode 3505. The wiring 3100*a* can be electrically connected to an electrode 3501*b* through an electrode 3503*a*. In this manner, the wiring 3100*a* and the electrode 3303 can be electrically connected to a source or a drain of the transistor 3171*a*. The electrode 3501*b* can be electrically connected to an electrode 3003*b* through an electrode 3502*b*. The electrode 3003*b* can be electrically connected to the wiring 3100*c* through an electrode 3503*b*.

FIG. 11 illustrates an example in which the electrode 3303 and the transistor 3171*a* are electrically connected to each other through the wiring 3100*a*; however, this embodiment is not limited thereto. The electrode 3303 and the transistor 3171*a* may be electrically connected to each other through the wiring 3100*b* or through both the wiring 3100*a* and the wiring 3100*b*. Alternatively, as illustrated in FIG. 12, the electrode 3303 and the transistor 3171*a* may be electrically connected to each other through neither the wiring 3100*a* nor the wiring 3100*b*. In FIG. 12, the electrode 3303 is electrically connected to the electrode 3003*b* through an electrode 3503. The electrode 3003*b* is electrically connected to the source or the drain of the transistor 3171*a*. The electrode 3303 and the transistor 3171*a* can be electrically connected to each other in this manner.

Note that FIG. 11 and FIG. 12 each illustrate an example in which two storage elements (the storage element 3170*a* and the storage element 3170*b*) are stacked; however, the number of storage elements to be stacked is not limited thereto.

Further, although FIG. 11 and FIG. 12 each illustrate a structure where two wiring layers (a wiring layer in which the wiring 3100*a* is formed and a wiring layer in which the wiring 3100*b* is formed) are provided between the layer in which the transistor 3171*a* is formed and the layer in which the transistor 3001 is formed, this embodiment is not limited to this structure. One wiring layer or three or more wiring layers may be provided between the layer in which the transistor 3171*a* is formed and the layer in which the transistor 3001 is formed.

Furthermore, although FIG. 11 and FIG. 12 each illustrate a structure where two wiring layers (a wiring layer in which the wiring 3100*c* is formed and a wiring layer in which the wiring 3100*d* is formed) are provided between the layer in which the transistor 3171*b* is formed and the layer in which the transistor 3171*a* is formed, this embodiment is not limited to this structure. One wiring layer or three or more wiring layers may be provided between the layer in which the transistor 3171*b* is formed and the layer in which the transistor 3171*a* is formed.

This embodiment can be combined with any of the above embodiments as appropriate.

EXAMPLE 1

A signal processing circuit according to one embodiment of the present invention is used, so that a low-power electronic device can be provided. In particular, in the case where a portable electronic device which has difficulty in continuously receiving power, an advantage of an increase in continuous operating time can be obtained when a low-power signal processing circuit according to one embodiment of the present invention is added as a component of the device. Further, with the use of a transistor with low off-state current, redundant circuit design which is needed to compensate high off-state current is not needed; thus, the integration degree of the signal processing circuit can be increased, and a signal processing circuit with higher functionality can be formed.

The signal processing circuit according to one embodiment of the present invention can be used for display devices, personal computers, or image reproducing devices provided with recording media (typically, devices which reproduce the content of recording media such as digital versatile discs (DVDs) and have displays for displaying the reproduced images). Further, as an electronic device which can include the signal processing circuit according to one embodiment of the present invention, cellular phones, portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

The case is described in which the signal processing circuit according to one embodiment of the present invention is applied to a portable electronic device such as a cellular phone, a smartphone, or an e-book reader.

Figure 13:
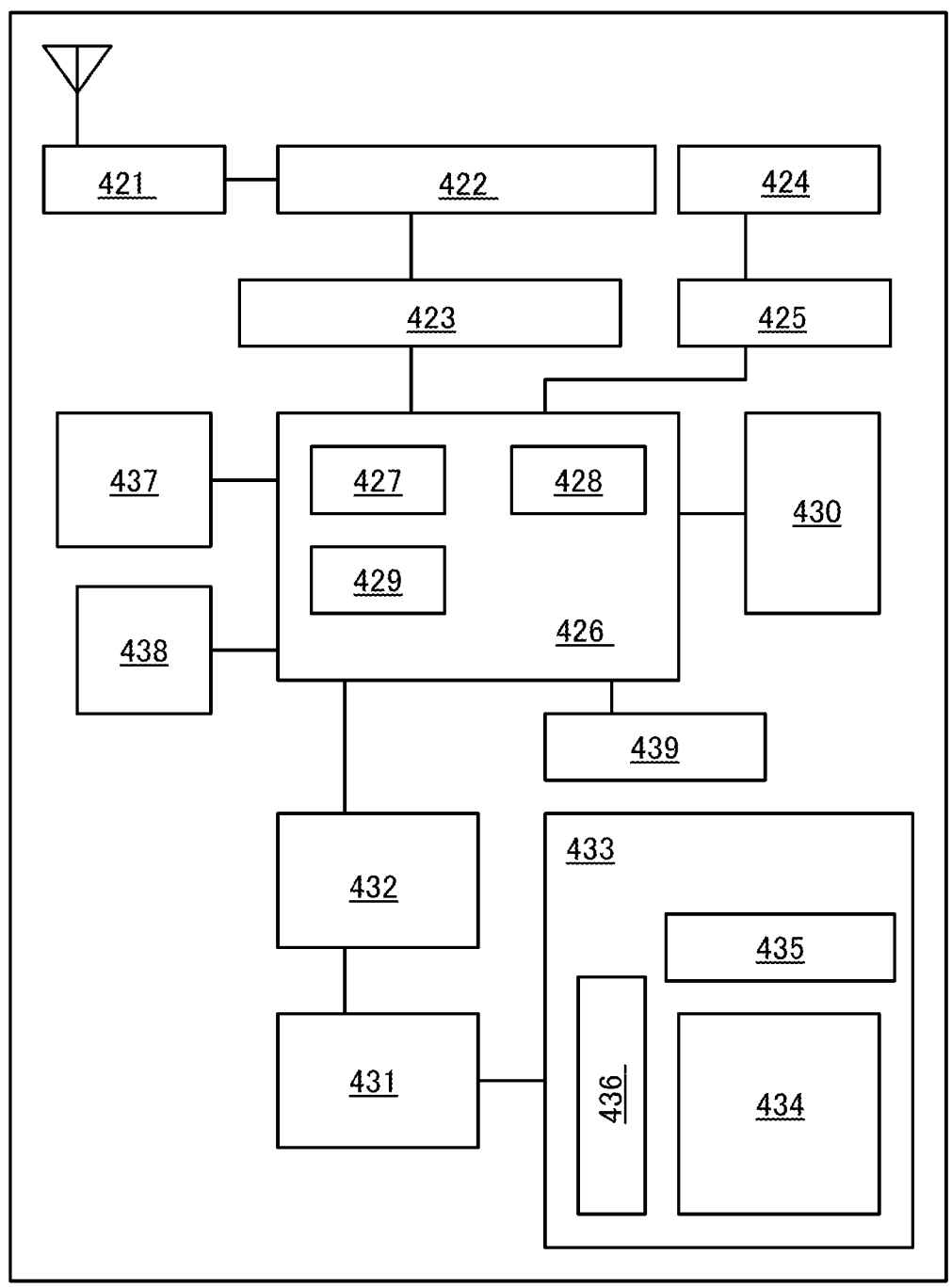
FIG. 13 is a block diagram of a portable electronic device.

FIG. 13 is a block diagram of a portable electronic device. The portable electronic device illustrated in FIG. 13 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. When the signal processing circuit described in the above embodiment is used as the CPU 427, power consumption can be reduced. The memory circuit 432 is generally formed using an SRAM or a DRAM; however, when the storage device described in the above embodiment is used as the memory circuit 432, power consumption can be reduced.

Figure 14:
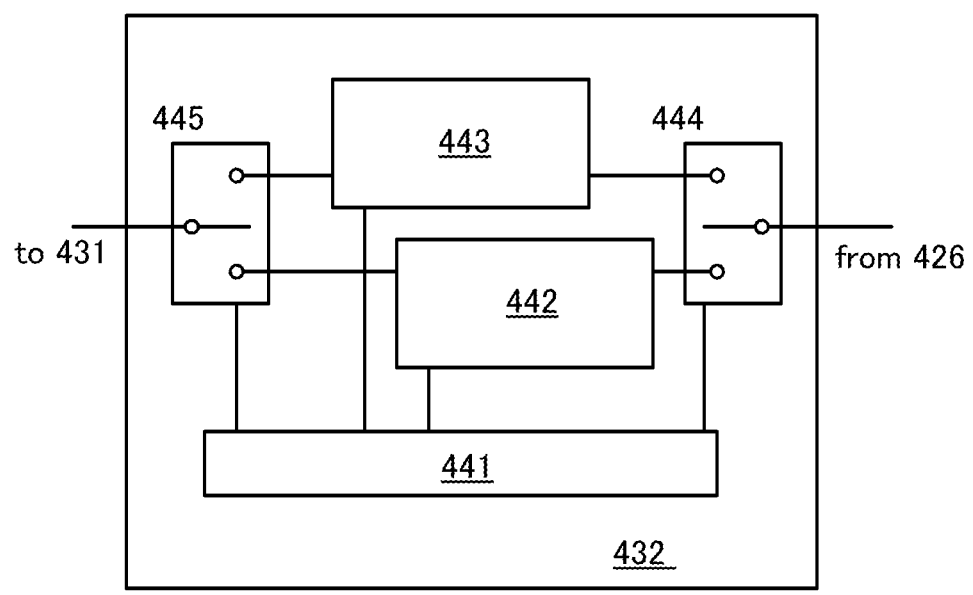
FIG. 14 is a block diagram of a memory circuit.

FIG. 14 is a block diagram illustrating the structure of the memory circuit 432. The memory circuit 432 includes a storage device 442, a storage device 443, a switch 444, a switch 445, and a memory controller 441.

First, image data is received in the portable electronic device or is formed by the application processor 426. This image data is stored in the storage device 442 through the switch 444. The image data output through the switch 444 is transmitted to the display 433 through the display controller 431. The display 433 displays an image with the use of the image data.

In the case where an image to be displayed is not changed as in a still image, image data read from the storage device 442 is usually transmitted continuously to the display controller 431 through the switch 445 at a frequency of approximately 30 to 60 Hz. When a user rewrites an image to be displayed on a screen, the application processor 426 forms new image data, and the image data is stored in the storage device 443 through the switch 444. Even when new image data is stored in the storage device 443, image data is periodically read from the storage device 442 through the switch 445.

After storage of new image data in the storage device 443 is terminated, the new image data stored in the storage device 443 is read in the next frame period, and the image data is transmitted to the display 433 through the switch 445 and the display controller 431. The display 433 displays an image with the use of the transmitted new image data.

Reading of the image data is continuously performed until the next new image data is stored in the storage device 442. The storage device 442 and the storage device 443 alternately write and read image data in this manner, and the display 433 displays an image.

The storage device 442 and the storage device 443 are not always different storage devices. A memory region of one storage device may be divided and used. When the storage device described in the above embodiment is used as the storage device, power consumption can be reduced.

Figure 15:
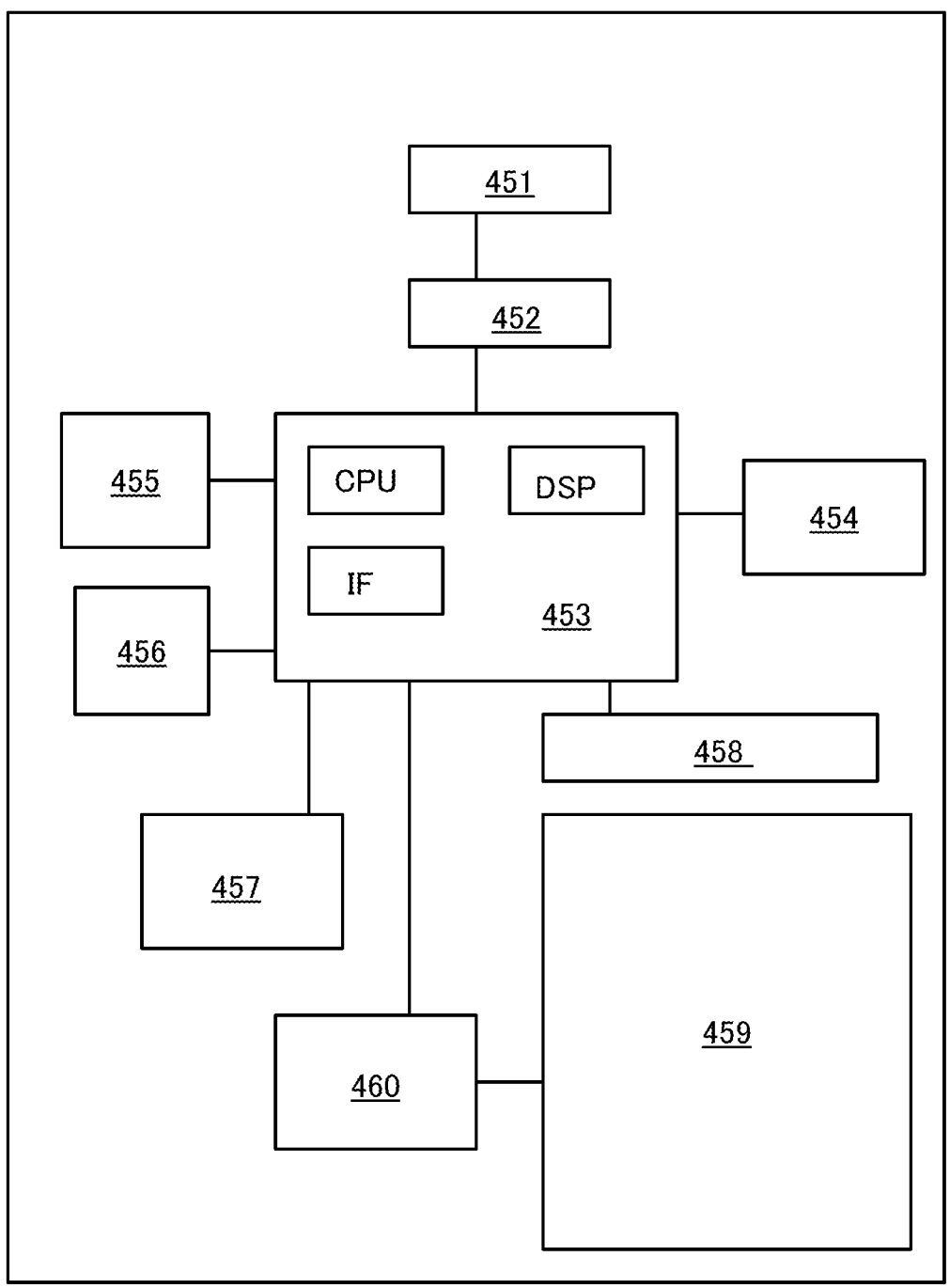
FIG. 15 is a block diagram of an e-book reader.

FIG. 15 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. When the signal processing circuit described in the above embodiment is used as the microprocessor 453, power consumption can be reduced. Further, when the storage device described in the above embodiment is used as the memory circuit 457, power consumption can be reduced.

For example, when the user utilizes a highlighting function for clarifying a difference between a specific area of book data and the other areas by changing the color of a character, underlining a character, bolding a character, or changing the font of a character in the specific area of the book data, it is necessary to store data in the portion of the book data that is specified by the user. The memory circuit 457 temporarily stores the data. Note that in the case where the data is stored for a long time, the data may be copied to the flash memory 454.

This example can be combined with any of the above embodiments as appropriate.

This application is based on Japanese Patent Application serial No. 2011-005614 filed with Japan Patent Office on Jan. 14, 2011, the entire contents of which are hereby incorporated by reference.

What is claimed is:
1. A semiconductor device comprising:
a first storage element comprising:
a first inverter;
a second inverter;
a first transistor comprising a channel formation region in an oxide semiconductor layer;
a first switch;
a first input terminal; and
a first output terminal,
wherein the first input terminal is electrically connected to an input terminal of the first inverter and an output terminal of the second inverter through the first switch,
wherein the first output terminal is electrically connected to an input terminal of the second inverter and a first terminal of the first transistor,
wherein an output terminal of the first inverter is electrically connected to a second terminal of the first transistor,
wherein one of the first inverter and the second inverter is provided on a first electrical path between the first switch and the first transistor, and wherein the other of the first inverter and the second inverter is provided on a second electrical path between the first switch and the first transistor.
2. The semiconductor device according to claim 1,
wherein the first storage element further comprises a first capacitor,
wherein a first electrode of the first capacitor is electrically connected to the first output terminal.
3. The semiconductor device according to claim 1,
wherein the first storage element further comprises a first clock terminal,
wherein a first terminal of the first switch is electrically connected to the first input terminal, and
wherein a second terminal of the first switch is electrically connected to the input terminal of the first inverter and the output terminal of the second inverter, and
wherein a first control terminal of the first switch is electrically connected to the first clock terminal.
4. The semiconductor device according to claim 1,
wherein the first storage element further comprises a first capacitor and a first clock terminal,
wherein a first electrode of the first capacitor is electrically connected to the first output terminal,
wherein a first terminal of the first switch is electrically connected to the first input terminal, and
wherein a second terminal of the first switch is electrically connected to the input terminal of the first inverter and the output terminal of the second inverter, and
wherein a first control terminal of the first switch is electrically connected to the first clock terminal.
5. A semiconductor device according to claim 1, further comprising:
a second storage element comprising:
a third inverter;
a fourth inverter;
a second transistor comprising an oxide semiconductor layer;
a second input terminal; and
a second output terminal,
wherein the second input terminal is electrically connected to an input terminal of the third inverter and an output terminal of the fourth inverter,
wherein the second output terminal is electrically connected to an input terminal of the fourth inverter and a first terminal of the second transistor,
wherein an output terminal of the third inverter is electrically connected to a second terminal of the second transistor, and
wherein the first output terminal is electrically connected to the second input terminal.
6. A signal processing circuit comprising:
a CPU;
a memory; and
a peripheral control device for controlling access between the memory and the CPU,
wherein the CPU, the memory, and the peripheral control device each comprise the semiconductor device according to claim 1.
7. A method for driving a semiconductor device, the semiconductor device comprising:
a first storage element comprising:
a first inverter;
a second inverter;
a first transistor comprising an oxide semiconductor layer;
a first switch;
a first input terminal;

a first output terminal;
a first clock terminal; and
a first control terminal,
wherein the first input terminal is electrically connected to a first terminal of the first switch,
wherein a second terminal of the first switch is electrically connected to an input terminal of the first inverter and an output terminal of the second inverter,
wherein a first control terminal of the first switch is electrically connected to the first clock terminal,
wherein the first output terminal is electrically connected to an input terminal of the second inverter and a first terminal of the first transistor,
wherein an output terminal of the first inverter is electrically connected to a second terminal of the first transistor, and
wherein a gate of the first transistor is electrically connected to the first control terminal,
the method for driving the semiconductor device comprising the steps of:
supplying a first voltage to the first clock terminal in a first period;
supplying a third voltage to the first control terminal in a second period after the first period; and
stopping supply of power supply voltage to the first storage element in a third period after the second period.

8. The method for driving the semiconductor device according to claim 7,
wherein the first storage element further comprises a first inversion clock terminal electrically connected to a second control terminal of the first switch,
wherein the method further comprises the steps of:
supplying a second voltage to the first inversion clock terminal in the first period; and
supplying the first voltage to the first inversion clock terminal in a fourth period after the third period.

9. The method for driving the semiconductor device according to claim 8, further comprising the steps of:
supplying the second voltage to the first inversion clock terminal in a fifth period after the fourth period.

10. The method for driving the semiconductor device according to claim 7, further comprising the steps of:
supplying power supply voltage to the first storage element in a sixth period after the third period;
supplying a fourth voltage to the first control terminal in a seventh period after the sixth period; and
supplying a second voltage to the first clock terminal in a eighth period after the seventh period.

11. The method for driving the semiconductor device according to claim 7,
wherein the first storage element further comprises a first inversion clock terminal electrically connected to a second control terminal of the first switch,
wherein the method further comprises the steps of:
supplying a second voltage to the first inversion clock terminal in the first period;
supplying the first voltage to the first inversion clock terminal in a fourth period after the third period;
supplying the second voltage to the first inversion clock terminal in a fifth period after the fourth period;
supplying power supply voltage to the first storage element in a sixth period after the fifth period;
supplying a fourth voltage to the first control terminal in a seventh period after the sixth period; and
supplying the second voltage to the first clock terminal in a eighth period after the seventh period.

12. A method for driving a semiconductor device, the semiconductor device comprising:
a first storage element comprising:
a first inverter;
a second inverter;
a first transistor comprising an oxide semiconductor layer;
a first switch;
a first input terminal;
a first output terminal;
a first inversion clock terminal; and
a first control terminal,
wherein the first input terminal is electrically connected to a first terminal of the first switch,
wherein a second terminal of the first switch is electrically connected to an input terminal of the first inverter and an output terminal of the second inverter,
wherein a first control terminal of the first switch is electrically connected to the first inversion clock terminal,
wherein the first output terminal is electrically connected to an input terminal of the second inverter and a first terminal of the first transistor,
wherein an output terminal of the first inverter is electrically connected to a second terminal of the first transistor, and
wherein a gate of the first transistor is electrically connected to the first control terminal,
the method for driving the semiconductor device comprising the steps of:
supplying a first voltage to the first inversion clock terminal in a first period;
supplying a second voltage to the first inversion clock terminal in a second period after the first period;
supplying power supply voltage to the first storage element in a third period after the second period; and
supplying a third voltage to the first control terminal in a fourth period after the third period.

13. The method for driving the semiconductor device according to claim 12,
wherein the first storage element further comprises a first clock terminal electrically connected to a second control terminal of the first switch,
wherein the method further comprises the steps of:
supplying the second voltage to the first clock terminal in a fifth period after the fourth period.

* * * * *